(12) United States Patent
Abe

(10) Patent No.: US 7,209,101 B2
(45) Date of Patent: Apr. 24, 2007

(54) CURRENT LOAD DEVICE AND METHOD FOR DRIVING THE SAME

(75) Inventor: Katsumi Abe, Tokyo (JP)

(73) Assignee: NEC Corporation, Tokyo (JP)

( * ) Notice: Subject to any disclaimer, the term of this patent is extended or adjusted under 35 U.S.C. 154(b) by 530 days.

(21) Appl. No.: 10/228,632

(22) Filed: Aug. 27, 2002

(65) Prior Publication Data

US 2004/0041750 A1    Mar. 4, 2004

(51) Int. Cl.
*G09G 3/30* (2006.01)
(52) U.S. Cl. ............... 345/76; 345/211; 345/77; 315/169.3
(58) Field of Classification Search ............ 345/76–84, 345/211; 315/169.3; 313/463
See application file for complete search history.

(56) References Cited

U.S. PATENT DOCUMENTS

| 6,373,454 | B1 * | 4/2002 | Knapp et al. ............ 345/76 |
| 6,806,857 | B2 | 10/2004 | Sempel et al. |
| 2001/0015626 | A1 | 8/2001 | Ozawa |

FOREIGN PATENT DOCUMENTS

| CN | 1381032 | 11/2002 |
| JP | 11-282419 | 10/1999 |
| WO | WO 99/38148 | 7/1999 |

OTHER PUBLICATIONS

R.M.A. Dawson, et al. The Impact of the Transient Response of Organic Light Emitting Diodes on the Deisgn of Active Matrix OLED Displays. pp. 875-878. Digest of IEDM 1998.
European Office Action Jun. 14, 2004.
Chinese Office Action dated May 13, 2005 for corresponding Chinese application 02132171.X.

* cited by examiner

*Primary Examiner*—Richard Hjerpe
*Assistant Examiner*—Duc Dinh
(74) *Attorney, Agent, or Firm*—Katten Muchin Rosenman LLP

(57) ABSTRACT

This invention provides a precise current load device. A cell includes a power supply line, a ground line, first and second voltage supply lines, a signal line, first, third and fourth control lines, first to fourth switches, a p-type TFT, a capacitance element, and a current load element. A source of the p-type TFT is connected to the power supply line, one terminal of the current load element is connected to the ground line, the first switch is connected between the signal line and a drain of the p-type TFT, the second switch is connected between the drain and the gate of the p-type TFT, the third switch is connected between the drain of the p-type TFT and the current load element, and the fourth switch is connected between the voltage supply line and the current load element.

26 Claims, 32 Drawing Sheets

2 : PIXEL
C : CAPACITANCE ELEMENT
CL1~CL3 : CONTROL LINE
LED : LIGHT EMITTING DEVICE
PB1~PB3 : POWER SUPPLY LINE
SL : SIGNAL LINE

2 : PIXEL
C : CAPACITANCE ELEMENT
CL1~CL3 : CONTROL LINE
LED : LIGHT EMITTING DEVICE
PB1~PB3 : POWER SUPPLY LINE
SL : SIGNAL LINE

PB5 : POWER SUPPLY LINE

2 : PIXEL
C : CAPACITANCE ELEMENT
CL1~CL4 : CONTROL LINE
LED : LIGHT EMITTING DEVICE
PB1~PB4 : POWER SUPPLY LINE
SL : SIGNAL LINE

VCC : POWER SUPPLY LINE
VS1 : VOLTAGE SUPPLY LINE

VS3: VOLTAGE SUPPLY LINE

VS2: VOLTAGE SUPPLY LINE

1: DISPLAY APPARATUS

VCC: POWER SUPPLY LINE
CL #K: CONTROL LINE

CURRENT LOAD DEVICE AND METHOD FOR DRIVING THE SAME

BACKGROUND OF THE INVENTION

1. Field of the Invention

The present invention relates to a current load driving circuit for driving a current load element and a method for driving the same. In particular, it relates to a current load device comprising current load elements and current load driving circuits arranged in a matrix, and a method for driving the same.

2. Description of the Prior Art

In recent years, a device having cells arranged in a matrix, each of the cells comprising a current load element that operates depending on a current passing therethrough and a current load driving circuit for driving the current load, has been developed.

For example, in many light emitting display devices with an organic EL (electroluminescence) device serving as the current load element, pixels each comprising the organic EL device and a drive circuit therefor are arranged in a matrix and driven according to the active matrix method. FIG. 37 is a schematic plan view of a display apparatus of such a light emitting display device. As shown in this drawing, on a display apparatus 1, there are formed a plurality of control lines CL extending in a row direction (the control lines are assigned consecutive numbers #1, #2, . . . , #(K−1), #K, #(K+1), . . . ) and a plurality of signal lines SL extending in a column direction (the signal lines are assigned consecutive numbers #1, #2, #(M−1), #M, #(M+1), . . . ). A pixel 2 is formed at an intersection of the control line CL and the signal line SL. This display device is driven as follows: the control lines CL are selected one by one; in synchronization with selection of one control line CL, the signal lines SL are supplied with brightness signals for pixels connected to the selected control line CL; in this state, the brightness signals are written to the pixels in the selected row; and the pixels continues the illumination according to the respective written signals until the control line is selected again.

A typical configuration of the pixel of the light emitting display device according to this method is shown in FIG. 38 (referred to as a first conventional example, hereinafter). As shown in FIG. 38, the signal line SL (#M), a power supply line VCC, a ground line GND and the control line CL (#K) pass through the pixel 2, and a light emitting device LED has an anode connected to the power supply line VCC and a cathode connected to the drain of a TFT (thin film transistor) Q, and the source of the TFT Q is connected to the ground line GND. A switch SW1 is connected between the gate of the TFT Q and the signal line SL and controlled by the control line CL. A capacitance element C is connected between the gate of the TFT Q and the ground line GND.

An operation of the pixel according to this first conventional example is as follows. When the control line CL is selected, the switch SW is turned on. At this time, a voltage enough to supply a current according to a current-brightness characteristic of the light emitting device LED is applied to the gate of the TFT Q through the signal line SL so as to cause the light emitting device LED to emit light with brightness at an intended gray-scale level. The gate voltage is maintained (retained) by the capacitance element C, even when the control line CL is deselected and the switch SW1 is turned off. This operation enables the light emitting device LED to maintain brightness at an expected gray-scale level.

The first conventional example has a disadvantage. That is, when there is un-unifomity in TFT's current/voltage characteristics, even if a same voltage is applied to gates, the light emitting devices are supplied with various currents. Consequently, the light emitting devices are not supplied with a current enough to provide an expected brightness, and thus, the quality of the display device is reduced. In particular, there is quite large deviation of current/voltage characteristics of poly-silicon TFTs, which are often used in display devices, so that the image quality thereof is significantly reduced.

To solve the problem, there has been implemented a method of supplying a current to a transistor in the pixel circuit through the signal line, converting the current into a voltage by the transistor and maintaining (retaining) the voltage.

FIG. 39 is a circuit diagram showing an arrangement of the pixel of the light emitting display device according to the method of supplying a current signal through the signal line, which is disclosed in Japanese Patent Laid-Open No. 11-282419 (referred to as a second conventional example, hereinafter). As shown in FIG. 39, a signal line SL (#M), a power supply line VCC, a ground line GND and a control line CL (#K) pass through a pixel 2. A light emitting device LED has an anode connected to the power supply line VCC and a cathode connected to the drain of a TFT Q1, and the source of the TFT Q1 is connected to the ground line GND. A switch SW1, which is controlled by the control line CL, is connected between the signal line SL and the drain of a TFT Q2, and the TFT Q2 has the gate and the drain short-circuited and the source connected to the ground line GND. A switch SW2, which is controlled by the control line CL, is connected between the gate of the TFT Q1 and the gate of the TFT Q2. In addition, a capacitance element C is connected between the gate of the TFT Q1 and the ground line GND.

An operation of the pixel according to this second conventional example is as follows. When the control line CL is selected, the switches SW1 and SW2 are turned on. At this time, a current according to a current-brightness characteristic of the light emitting device LED flows through the signal line SL to cause the light emitting device LED to emit light with a brightness at an intended gray-scale level. This current flows between the drain and source of the TFT Q2. However, since the gate and drain of the TFT Q2 are short-circuited, the gate voltage thereof is set at a value for passing the same current through the TFT Q2 in a saturation region, and the voltage is retained by the capacitance element C. The TFT Q1 and the TFT Q2 form a current mirror. Thus, if current/voltage characteristics of TFT Q1 are equal to those of the TFT Q2, a current, whose value is equal to that of the current flowing through TFTQ2 and the signal line SL, flows through the TFT Q1 and is supplied to the light emitting device LED. Then, even if the control line CL is deselected, the gate voltage of the TFT Q1 is maintained (retained) by the capacitance element C. Therefore, the TFT Q1 can supply the current to the light emitting device LED, and the light emitting device LED can maintain brightness at an expected gray-scale level.

FIG. 40 is a circuit diagram of one pixel of another light emitting display device according to the method of supplying a current required for light emission with an intended brightness through the signal line, which is disclosed in "Digest of IEDM" (1998), pp. 875–878 by R. M. A. Dawson et al. As shown in FIG. 40, a pixel 2 of this light emitting display device comprises a signal line SL (#M), a power supply line VCC, a ground line GND, a control line CL1 (#K) and a control line CL2 (#K) passing therethrough, four p-channel TFTs (p-TFT, hereinafter) Qp1 to Qp4, a light emitting device LED and a capacitance element C. The p-TFT Qp4 has the gate connected to the control line CL2, the source connected to the power supply line VCC and the drain connected to the source of the p-TFT Qp1. The drain of the p-TFT Qp1, as well as the drain of the p-TFT Qp3 having the gate connected to the control line CL1, is connected to an anode of the light emitting device LED. The source of the p-TFT Qp3 is connected to the gate of the p-TFT Qp1, and a cathode of the light emitting device LED is connected to the ground line GND. The p-TFT Qp2 has the gate connected to the control line CL1, the source connected to the signal line SL and the drain connected to the source of the p-TFT Qp1 and the drain of the p-TFT Qp4. In addition, the capacitance element C is connected between the gate and source of the p-TFT Qp1.

An operation of the pixel according to this third conventional example is as follows. If the pixel 2 is selected, the control line CL1 (#K1) enters into an "L" state, the control line CL2 (#K) enters into an "H" state, the p-TFT Qp2 and the p-TFT Qp3 are turned on, and the p-TFT Qp4 is turned off. Then, a current according to a current-brightness characteristic of the light emitting device LED flows through the signal line SL (#M) to cause the light emitting device LED to emit light with a brightness at an intended gray-scale level. This current is supplied to the light emitting device LED through the TFT Qp2 and TFT Qp1. At this time, the p-TFT Qp1 has the drain and the gate short-circuited via the drain and source of the p-TFT Qp3 and operates in the saturation state, the gate voltage of the p-TFT Qp1 is set at a value to provide the current, and the voltage is retained by the capacitance element C. When the selection of the control line shifts from the lines #K to the next, the control line CL1 (#K) enters into the "H" state, the control line CL2 (#K) enters into the "L" state, and the supply of the current from the signal line SL to the pixel is stopped. However, the p-TFT Qp4 is turned on, and the current flows through this transistor. In this case, the gate voltage of the p-TFT Qp1, when the current from the signal line SL flows through the p-TFT Qp1, is maintained (retained) by the capacitance element C. Therefore, the p-TFT Qp1 can supply the current to the light emitting device LED, and the light emitting device LED can maintain a brightness at an expected gray-scale level.

According to the first conventional example described above, the brightness depends on the voltage signal. However, there is quite large deviation of current/voltage characteristics of poly-silicon TFTs, and even if the same voltage is applied to the gates of TFTs, the light emitting devices are supplied with various currents, and thus, the brightness thereof varies. Therefore, there is a disadvantage that it is difficult to cause the light emitting device to emit light with an intended brightness, and the quality of the display device is reduced.

According to the second conventional example, a pair of transistors forming the current mirror are each constituted by a TFT. However, unlike with a crystalline silicon transistor, it is possible that the transistors of the pair have current/voltage characteristics which are significantly different from each other even when they are disposed close to each other. Therefore, a difference in current/voltage characteristics appears between the transistor for retaining (converting) the current and the transistor for supplying the current to the light emitting device, and thus, it becomes difficult to reproduce an intended brightness with high precision.

In the case of the third conventional example described above, if the organic EL or the like is used as the light emitting device, the light emitting device has a capacitance of the order of several pF in parallel therewith, and the capacitance constitutes a load on the driving TFT. Thus, when a pixel is to be selected, it takes a long time for the current value of the driving TFT to settle at a value for supplying an expected current to the light emitting device and for the voltages of the parts to settle in a state where the expected current is supplied to the light emitting device. Therefore, if the selection period is shortened to accommodate higher definition, the selection period will expire before the gate voltage of the p-TFT Qp1 settles at a value at which the current flowing through the signal line equals to the current the p-TFT Qp1 supplies to the light emitting device, and thus, the p-TFT Qp1 cannot supply an expected current to the light emitting device. Then, the light emitting device LED emits light with an unexpected brightness, and thus, the image quality is reduced. That is, the third conventional example has a disadvantage in that enhancing the definition reduces the image quality.

BRIEF SUMMARY OF THE INVENTION

This invention is to solve such problems of the prior art arising in driving a current load element, and in particular, a light emitting device, such as an organic EL device. A first object of this invention is to provide a current load device which can supply current load elements with high precision. A second object thereof is to provide a current load device which can be increased in definition and size without degradation in device characteristics by allowing a voltage between a source and gate of a driving TFT to quickly settle at a value for passing an expected current through the driving TFT.

In order to attain the objects, according to this invention, there is provided a current load device comprising: a driving transistor having a source connected to a power supply line or a ground line GND directly or via a transistor; a first switch connected between a signal line and a drain of the driving transistor; a second switch connected between the drain of the driving transistor or the signal line and a gate of the driving transistor; a capacitance element having one terminal connected to an appropriate voltage line and the other terminal connected to the gate of the driving transistor; and a serially-connected assembly of a current load element and a third switch, the serially-connected assembly being connected between the ground line or any power supply line and the drain of the driving transistor.

Preferably, the third switch is turned on when the first switch is turned off, and is turned off before the first switch is turned on. More preferably, a fourth switch, which operates oppositely to the third switch, is connected to the current load element in parallel. A ratio (W/L) between a length (L) and a width (W) of the gate of a dummy switch TFT may be half the ratio between the length and the width of the gate of a second switch TFT.

In addition, in order to attain the objects, according to this invention, there is provided a method for driving a current load device, the current load device being active-matrix driven and comprising a plurality of cells each comprising a current load element, a driving transistor for supplying a driving current to the current load element and a retention capacitance element for retaining a voltage to be applied to the driving transistor, wherein a current is not supplied to the current load element at least during a period in which the retention capacitance element conducts the retaining operation.

Preferably, the supply of the current to the current load element is stopped before the retention capacitance element starts the retaining operation. More preferably, when the supply of the current to the current load element is stopped, charges stored in the current load element are forcedly removed.

[Operation]

According to the arrangement of this invention described above, a switch is provided between the driving transistor for retaining and supplying the current and the current load element, and the switch is held in the of f state during a period of operation of retaining the current; that operation is to set a gate voltage of the driving TFT to flow an appropriate current between the drain and the source of the driving TFT via the signal line. Therefore, in retaining the current, the effect of the capacitance of the current load element can be eliminated and the current can be retained in a short time.

Besides, in the case of an arrangement in which the switch SW between the driving transistor for retaining and supplying the current and the current load element is turned off an arbitrary time after the start of the supply of the current to the current load element, the performance of the current load element becomes the time-average performance controlled by the ratio of operating and un-operating period of the current load element. In this case, to attain the same performance as in the case of not stopping the operation, the performance of the current load element needs to be increased while it operates and the current supplied to the current load element has to be increased, so that the current supplied to the signal line is also increased. Therefore, a time required for charging the capacitance of the signal line or load can be reduced, and a time required for retaining the current can be reduced.

In addition, if the current load element is a light emitting device, such as an organic EL device, since the display operation involves the state where the light emission is stopped as described above, the display operation is similar to that of CRTs (cathode ray tubes) and an afterimage is hard to remain, and thus, moving images can be displayed with higher quality.

DETAILED DESCRIPTION OF THE PREFERRED EMBODIMENTS

Now, embodiments of the present invention will be described in detail with reference to the drawings. In the following, the description will be made with regard to a light emitting device. However, it is illustrative only, and this invention can be applied to any typical current load element.

[First Embodiment]

Figure 1:
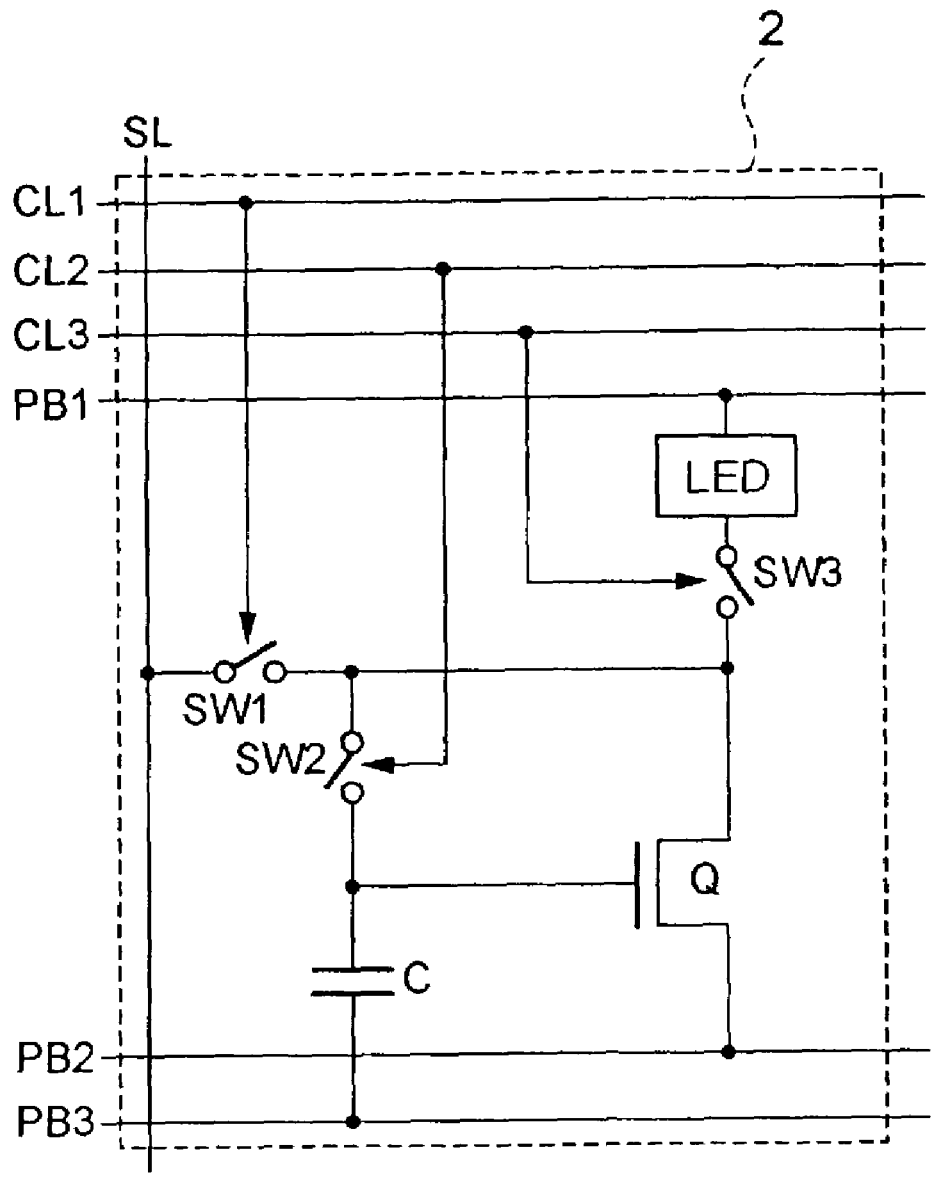
FIG. 1 is a diagram showing a configuration of a pixel according to the first embodiment of this invention.

FIG. 1 is a circuit diagram showing a configuration of one pixel according to a first embodiment of this invention. As shown in FIG. 1, a signal line SL extending in a column direction, control lines CL1 to CL3 extending in a row direction and voltage supply lines PB1 to PB3 run through a pixel 2, and a TFT Q, switches SW1 to SW3, a capacitance element C and a light emitting device LED are arranged in the pixel 2. A first terminal of the TFT Q, which is one of the drain or source thereof, is connected to the voltage supply line PB2, the switch SW3 is connected between a second terminal of the TFT Q, which is the other of the drain or source thereof, and the light emitting device LED, and the switch SW1 is connected between the second terminal of the TFT Q and the signal line SL. A terminal of the light emitting device LED on the other side of the switch SW3 is connected to the voltage supply line PB1. The switch SW2 is connected between the second terminal and gate of the TFT Q, and the capacitance element C is connected between the gate of the TFT Q and the voltage supply line PB3. Here, the switches SW1, SW2 and SW3 are controlled by the control lines CL1, CL2 and CL3, respectively.

Figure 2:
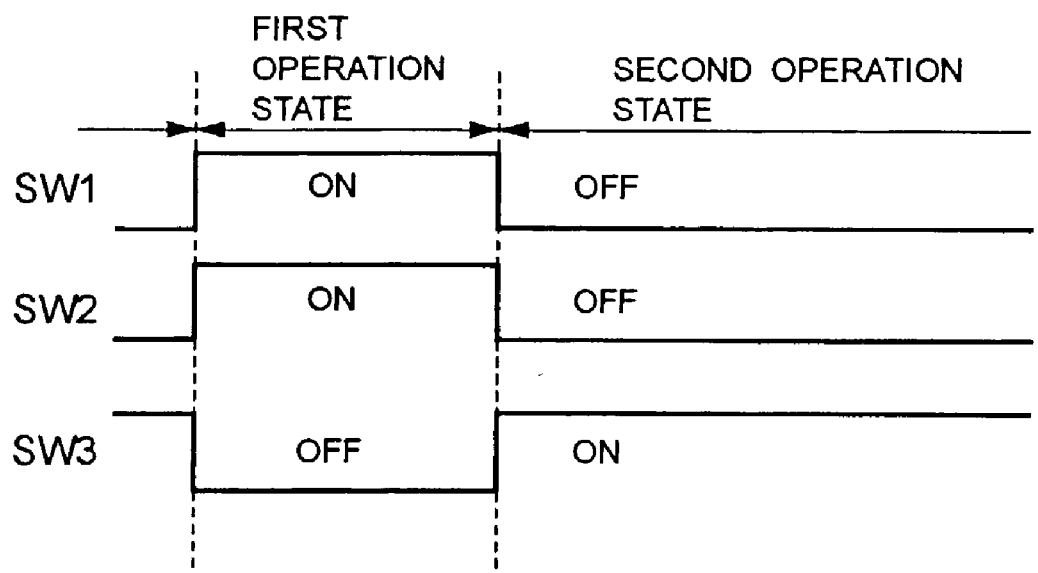
FIG. 2 is a timing chart of an (first) operation example according to the first embodiment of this invention.

FIG. 2 is a timing chart of a first example of an operation according to the first embodiment shown in FIG. 1. According to this operation example, in a first operation state (current retaining state or row selection period), the switch SW1 is turned on by the control line CL1, the switch SW2 is turned on by the control line CL2 and the switch SW3 is turned off by the control line CL3. At this time, a current for providing an intended gray-scale is supplied to the signal line SL based on the current-brightness characteristic of the light emitting device LED.

In the first operation state, the TFT Q operates in the saturation region because the second terminal and gate thereof are short-circuited by the switch SW2. Besides, since the switch SW3 has been turned off, any current does not flow through the light emitting device LED, and the light emitting device LED does not operate (emit light). The current supplied from the signal line SL flows into the TFT Q, and depending on the current/voltage characteristics of the TFT Q, the gate voltage of the TFT Q is set at a value for passing the current across the drain and source thereof. At this time, the current from the signal line SL is not supplied to the capacitance of the light emitting device LED, and therefore, the gate voltage of the TFT Q is quickly set at the value for passing the current from the signal line SL across the drain and source of the TFT Q.

The subsequent second operation state (current supplying state) is a state where a row other than that including the shown pixel in the display device is selected, in which the switch SW1 is turned off by the control line CL1, the switch SW2 is turned off by the control line CL2 and the switch SW3 is turned on by the control line CL3.

In the second operation state, the gate voltage of the TFT Q is held by the capacitance element C at the value in the first operation state. Thus, the TFT Q can supply the current supplied thereto from the signal line SL in the first operation state to the light emitting device LED through the switch SW3, and the light emitting device LED operates (emits light) to provide a brightness at an intended gray-scale level.

According to this embodiment, the TFT Q in the pixel retains, depending on the current/voltage characteristics thereof, the gate voltage value to flow a current through the TFT Q from the signal line SL, and the TFT Q having retained the gate voltage value supplies the current, whose value is the same of the current from the signal line SL in the retaining state, to the light emitting device LED. Therefore, the current can be retained and supplied with high precision regardless of the current/voltage characteristics of the TFT Q.

For the operation shown in FIG. 2, since the control lines CL1 and CL2 operate the same, they can be integrated into one control line. Furthermore, in the case where the switches are constituted by TFTs with the types of conductivity differing between the switches SW1, SW2 and the switch SW3, the control lines CL1 to CL3 can be integrated into one control line.

Figure 3:
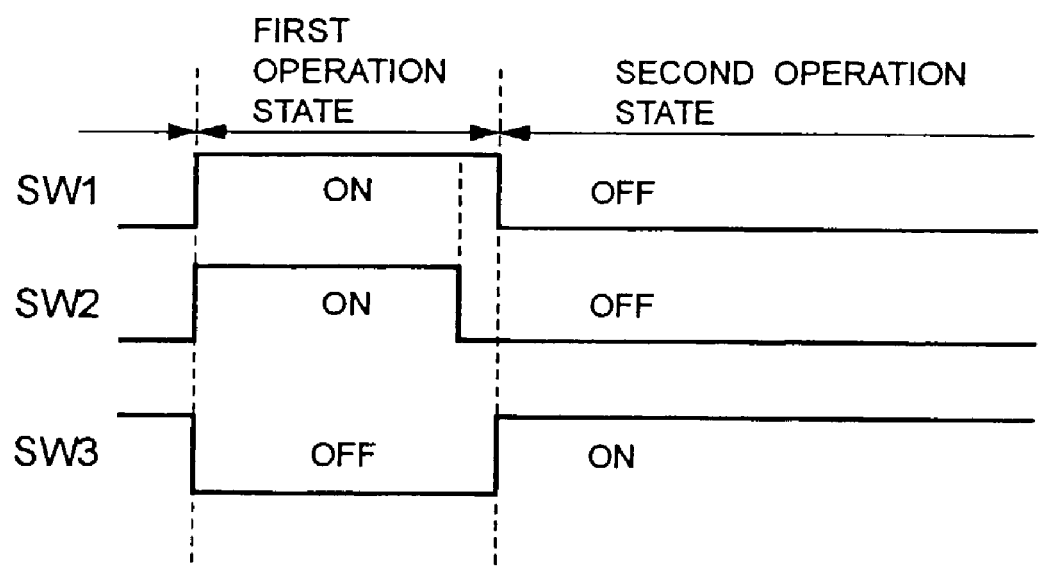
FIG. 3 is a timing chart of (second) another operation example according to the first embodiment of this invention.

FIG. 3 is a timing chart of a second operation example according to the first embodiment shown in FIG. 1. A difference between this operation example and the first operation example shown in FIG. 2 is that, in the first operation state, the switch SW2 is turned off earlier than the switch SW1. For such an operation, if the switch SW2 is an element having a capacitance between the gate and the drain, such as TFT, a TFT having the source and the drain short-circuited can be connected between the switch SW2 and the gate of the TFT Q as a dummy switch.

In the operation example shown in FIG. 3, the control lines CL1 and CL2 cannot be integrated. However, since the switches SW1 and SW3 are reverse-acting switches, the switches SW1 and SW3 can be constituted by the TFTs with different types of conductivity (polarity), whereby the control lines CL1 and CL3 can be integrated.

Figure 4:
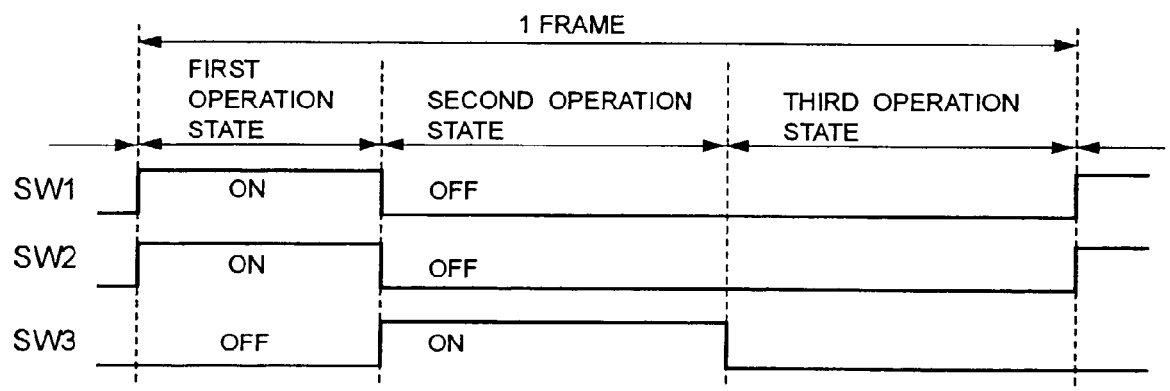
FIG. 4 is a timing chart of (third) another operation example according to the first embodiment of this invention.

FIG. 4 is a timing chart of a third operation example according to the first embodiment shown in FIG. 1. According to this operation example, in the first operation state (current retaining state or row selection period), the shown pixel is selected, the switch SW1 is turned on by the control line CL1, the switch SW2 is turned on by the control line CL2 and the switch SW3 is turned off by the control line CL3. Thus, the same operation as the first operation example shown in FIG. 2 is conducted.

The subsequent second operation state (current supplying state) is a state where a row other than that including the pixel shown in FIG. 1 is selected, in which the switch SW1 is turned off by the control line CL1, the switch SW2 is turned off by the control line CL2 and the switch SW3 is turned on by the control line CL3.

In this state, the gate voltage of the TFT Q is identical to that retained by the capacitance element C in the first operation state, and the TFT Q supplies the current supplied thereto from the signal line SL in the first operation state to the light emitting device LED through the switch SW3 to cause the light emitting device LED to emit light with a brightness at an intended gray-scale level.

In the subsequent third operation state (current stop state), the row other than that including the shown pixel has been selected, and the switch SW3 is turned off by the control line CL3 before the row including the shown pixel is selected again. Thus, the supply of the current to the light emitting device LED is stopped, and the light emitting device LED stops the operation thereof (light emission).

In the third operation example, among the first to third operation states, the light emitting device LED emits light in the second operation state, stops light emission for a short while in the first operation state and does not emit light in the third operation state. Therefore, it is possible to cause the light emitting device LED to emit light only for a fraction of one frame period. For example, if the light emitting device is caused to emit light for one third of one frame period, three times the current is to be supplied thereto to provide the same time-average brightness as in the case of light emission for the whole period. If the current value is raised, a time required for charging a wiring capacitance such as signal line can be reduced, and the period of the first operation state required for retaining the current can be shortened. Therefore, this operation example is ready for the increase in wiring capacitance due to higher definition and larger screen. In addition, since the light emitting device does not emit light in the third operation state in this operation example, the display operation is similar to that of CRTs and an afterimage is hard to remain, and thus, moving images can be displayed with high quality.

In driving according to this operation example, the switches SW1 and SW2 operate the same, and thus, the control lines CL1 and CL2 can be integrated.

The third and second operation examples can be combined with each other. That is, the timing chart shown in FIG. 4 can be modified so that the switch SW2 is turned off before the first operation state expires.

[Second Embodiment]

Figure 5:
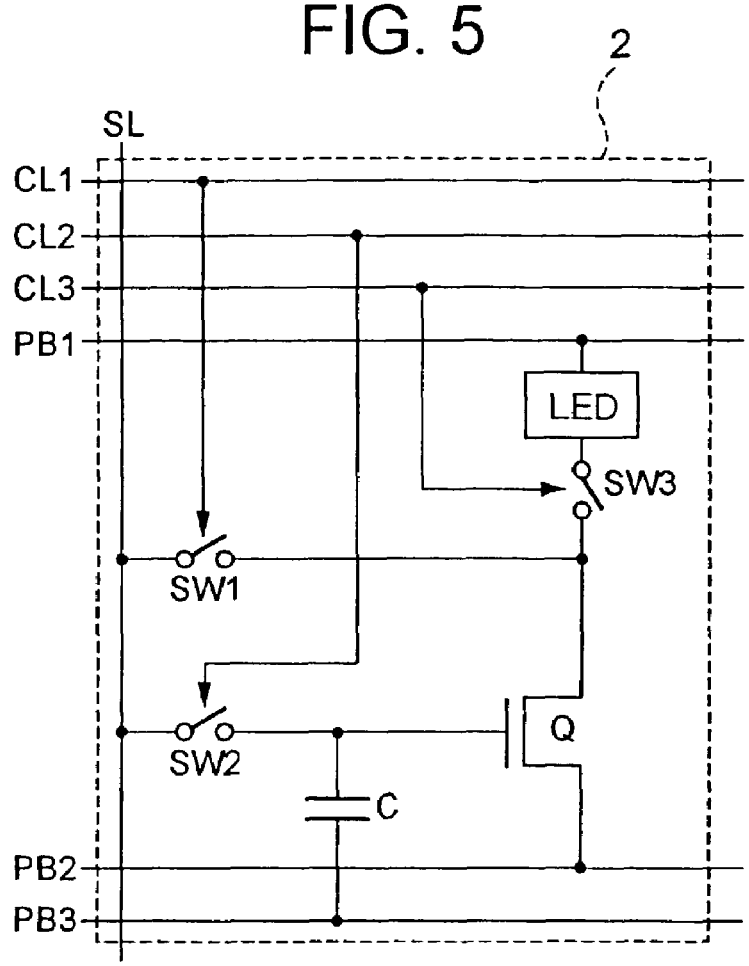
FIG. 5 is a diagram showing a configuration of a pixel according to the second embodiment of this invention.

FIG. 5 is a circuit diagram showing a configuration of one pixel according to a second embodiment of this invention. As shown in FIG. 5, a signal line SL extending in a column direction, control lines CL1 to CL3 extending in a row direction and voltage supply lines PB1 to PB3 run through a pixel 2, and a TFT Q, switches SW1 to SW3, a capacitance element C and a light emitting device LED are arranged in the pixel 2. A first terminal of the TFT Q, which is one of the drain or source thereof, is connected to the voltage supply line PB2, the switch SW3 is connected between a second terminal of the TFT Q, which is the other of the drain or source thereof, and the light emitting device LED, and the switch SW1 is connected between the second terminal of the TFT Q and the signal line SL. A terminal of the light emitting device LED on the other side of the switch SW3 is connected to the voltage supply line PB1. The switch SW2 is connected between the signal line SL and the gate of the TFT Q, and the capacitance element C is connected between the gate of the TFT Q and the voltage supply line PB3. Here, the switches SW1, SW2 and SW3 are controlled by the control lines CL1, CL2 and CL3, respectively.

Figure 6:
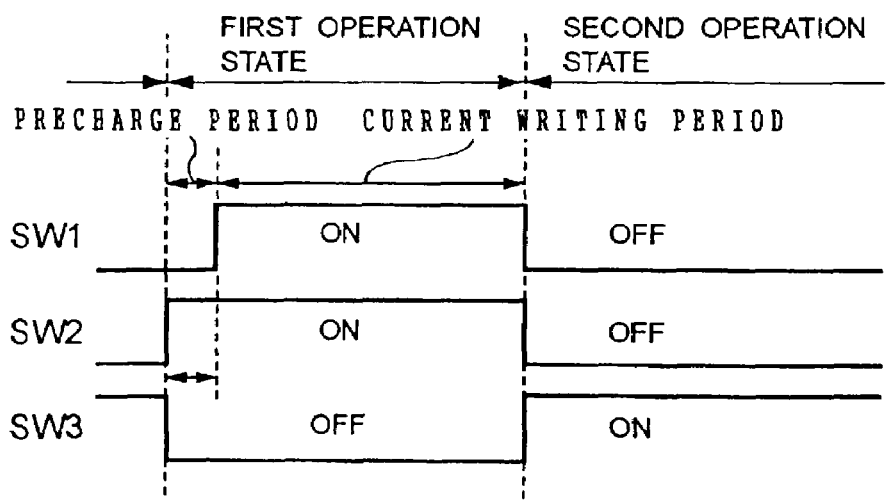
FIG. 6 is a timing chart of an operation example according to the second embodiment of this invention.

FIG. 6 is a timing chart of a first operation example according to this embodiment. According to this operation example, a first operation state (current retaining state or row selection period) includes a precharge (voltage application) period and a current writing period. Providing the precharge period and applying an appropriate voltage during the precharging enable the first operation state to be shortened, in particular, in the case where a low current is to be retained in the pixel circuit.

According to the first operation example of this embodiment, in the precharge period in the first operation state, the shown pixel 2 is selected, the switches SW1 and SW3 are turned off, and the switch SW2 is turned on to apply a precharge voltage to the capacitance element C and the gate of the TFT Q through the signal line SL. Then, in the current writing period in the first operation state, as in the first embodiment, the switches SW1 and SW2 are turned on and the switch SW3 is turned off to apply to the capacitance element C and the gate of the TFT Q a voltage for passing the current supplied through the signal line SL across the drain and source of the TFT Q, thereby retaining the current.

According to the operation example of the first embodiment, the voltage is applied to the capacitance element C relying on the current, a low current value would be affected by the load of the signal line SL or the like, so that it would take a long time for the voltage applied to the gate of the TFT Q and the capacitance element to be settled. Thus, a long first operation state would be needed. To the contrary, according to this operation example, the precharge period in the first operation state, in which the voltage is precharged in the gate of the TFT Q and the capacitance element C, is short. When the precharged voltage is changed to an appropriate voltage to be applied to the gate of the TFT Q and the capacitance element C during the current writing period, the current writing period can also be reduced. Thus, the first operation state (total of the precharge period and the current writing period) can be reduced.

A second operation state (current supplying state) is a state where a pixel in a row other than the shown row is selected, in which as in the first embodiment, the switches SW1 and SW2 are turned off and the switch SW3 is turned on to supply the retained current from the TFT Q to the light emitting device LED.

The precharging operation in this operation example can be realized by changing the signal applied to the pixel 2 through the signal line SL without changing the timings of the switching operations according to the first embodiment. However, according to the first embodiment, if a voltage is applied to the gate of the TFT Q and the capacitance element C through the signal line SL in the precharge period in the first operation state, the voltage may be different from the voltage applied to the signal line SL because a current path is established. To the contrary, according to the second embodiment, since only the switch SW 2 is in on state in the precharge period in the first operation state, no current path is established during the precharging. Thus, a precise voltage can be advantageously precharged to the gate of the TFT Q and the capacitance element C.

In this operation example, the timing for switching the switch SW1 from the off state to the on state is modified. Modifying the second and third operation examples of the first embodiment in this way can provide the first embodiment with the advantages of the first operation example of the second embodiment in addition to its original advantages. On the other hand, according to the second embodiment, all the operation example of the first embodiment is possible, and the advantages thereof are also provided. Furthermore, as in the first embodiment, the configuration of the pixel 2 can be simplified by appropriately selecting the types of conductivity of the transistors and integrating the control lines for the operations.

[Third Embodiment]

Figure 7:
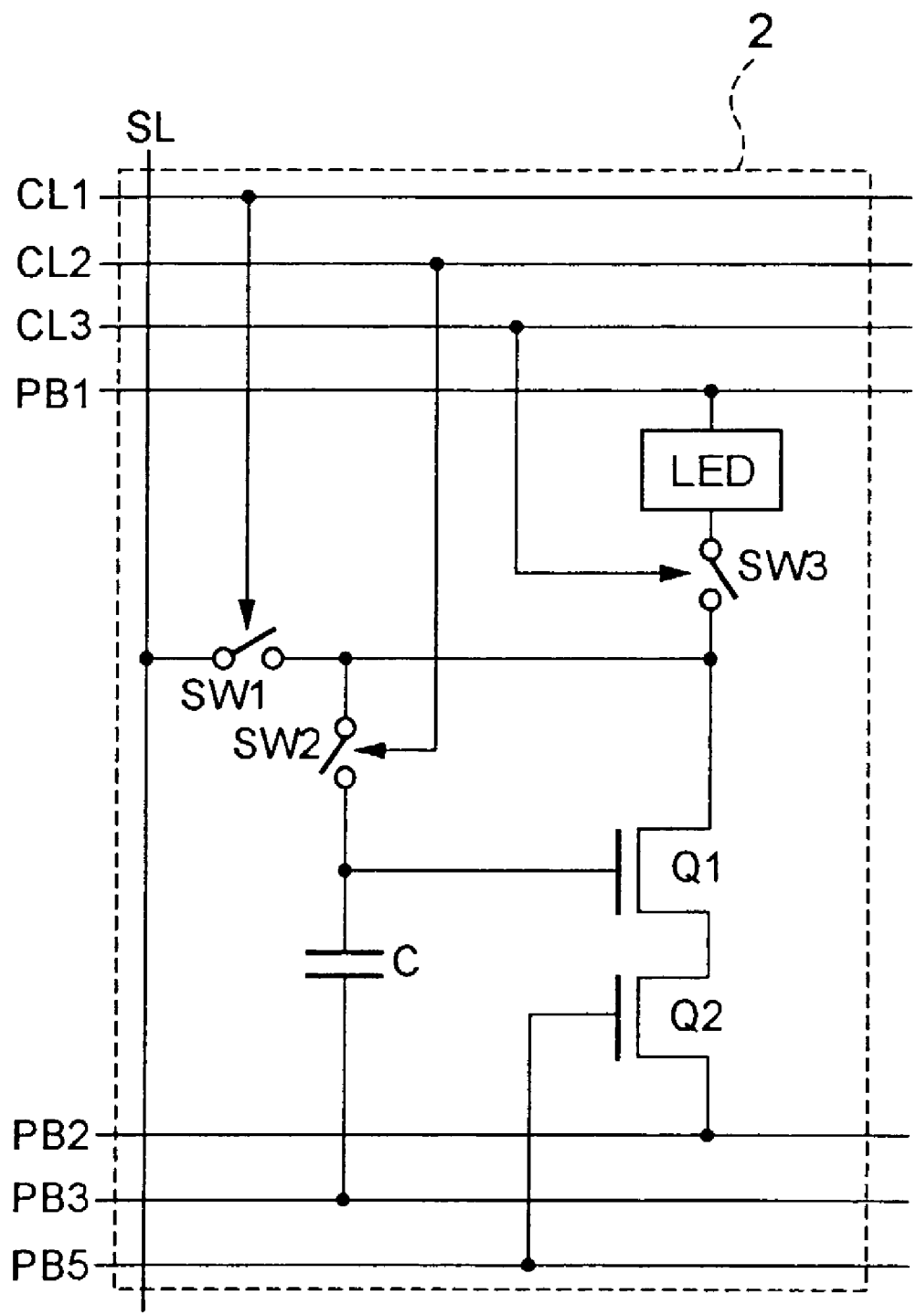
FIG. 7 is a diagram showing a configuration of a pixel according to the third embodiment of this invention.

FIG. 7 is a circuit diagram showing a configuration of one pixel according to a third embodiment of this invention. As shown in FIG. 7, a signal line SL extending in a column direction, control lines CL1 to CL3 extending in a row direction and voltage supply lines PB1 to PB3 and PB5 run through a pixel 2, and a TFT Q1, a TFT Q2, switches SW1 to SW3, a capacitance element C and a light emitting device LED are arranged in the pixel 2. The TFT Q1 and the TFT Q2 are connected in series, one of the drain and source of the TFT Q2, which is not connected to the TFT Q1, is connected to the voltage supply line PB2, the switch SW3 is connected between the light emitting device LED and one of the drain and source of the TFT Q1, which is not connected to the TFT Q2, and the switch SW1 is connected between the signal line SL and the terminal of the TFT Q1, which is not connected to the TFT Q2. A terminal of the light emitting device LED on the other side of the switch SW3 is connected to the voltage supply line PB1. The switch SW2 is connected between the gate of the TFT Q1 and the terminal thereof, which is not connected to the TFT Q2, the capacitance element C is connected between the gate of the TFT Q1 and the voltage supply line PB3, and the gate of the TFT Q2 is connected to the voltage supply line PB5. Here, the switches SW1, SW2 and SW3 are controlled by the control lines CL1, CL2 and CL3, respectively.

According to the third embodiment, the TFT Q2, which is biased by the voltage supply line PB5, is provided. Therefore, the TFT Q1 and the TFT Q2 are cascode-connected to each other and can be both made to operate in the saturation region. Thus, the drain bias dependency of the current/voltage characteristic of TFT Q1 in the saturation region can be improved.

According to the third embodiment, the TFT Q2, which is biased by the voltage supply line PB5, is provided. Therefore, the TFT Q1 and the TFT Q2 are cascode-connected to each other and can be both made to operate in the saturation region. Thus, the drain bias dependency of the TFT Q1 in the saturation region can be improved.

The operation of the pixel in the third embodiment is the same as in the first embodiment except for the operation of the TFT Q2, and the advantages of the operation examples in the first embodiment can be provided. Furthermore, in this embodiment, changing the connection of the switches can realize the same operation as in the second embodiment, and the advantages of the operation example thereof can be provided.

[Fourth Embodiment]

Figure 8:
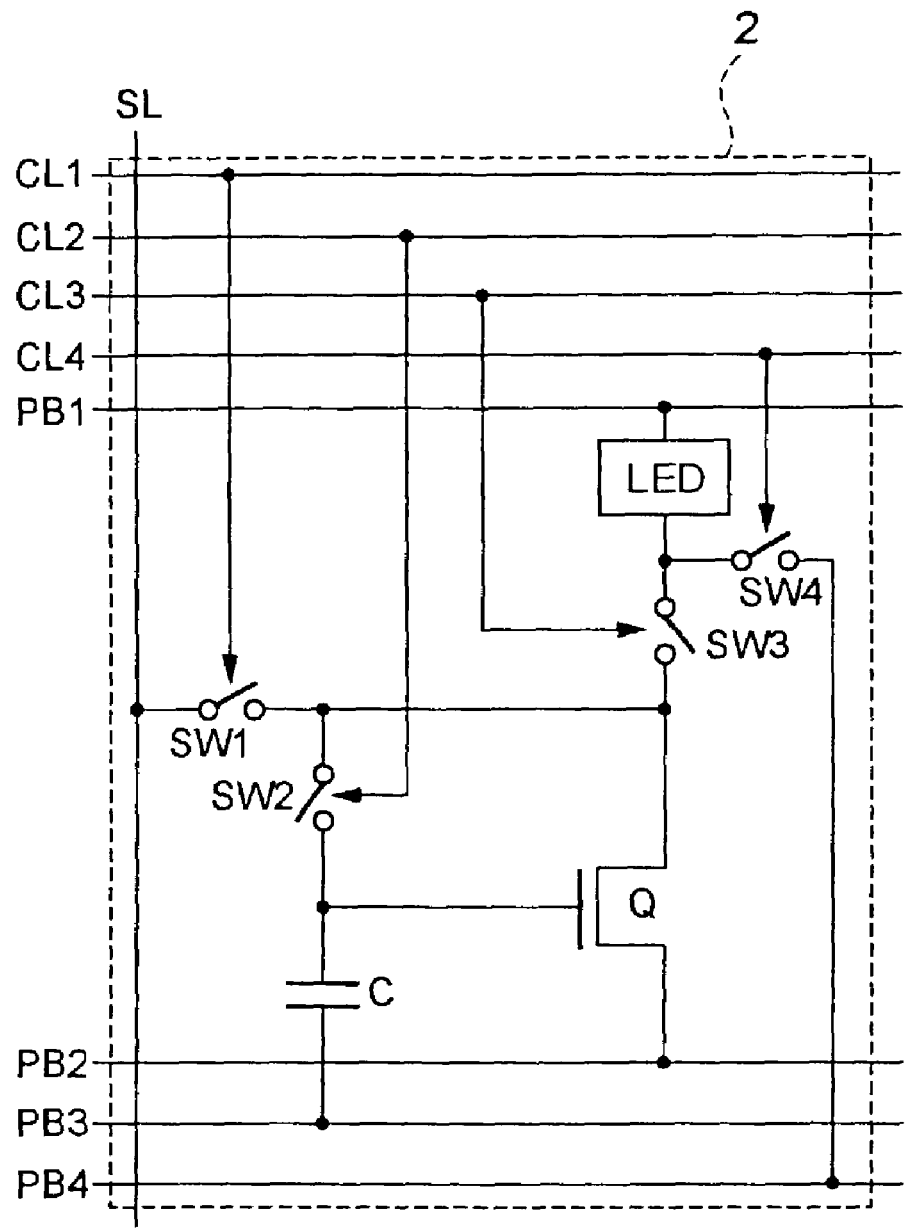
FIG. 8 is a diagram showing a configuration of a pixel according to the fourth embodiment of this invention.

FIG. 8 is a circuit diagram showing a configuration of one pixel according to a fourth embodiment of this invention. As shown in FIG. 8, a signal line SL extending in a column direction, control lines CL1 to CL4 extending in a row direction and voltage supply lines PB1 to PB4 run through a pixel 2, and a TFT Q, switches SW1 to SW4, a capacitance element C and a light emitting device LED are arranged in the pixel 2. A first terminal of the TFT Q, which is one of the drain or source thereof, is connected to the voltage supply line PB2, the switch SW3 is connected between a second terminal of the TFT Q, which is the other of the drain or source thereof, and the light emitting device LED, and the switch SW1 is connected between the second terminal of the TFT Q and the signal line SL. A terminal of the light emitting device LED on the other side of the switch SW3 is connected to the voltage supply line PB1. The switch SW4 has one terminal connected between the light emitting device LED and the switch SW3 and the other terminal connected to the voltage supply line PB4. The switch SW2 is connected between the second terminal and gate of the TFT Q, and the capacitance element C is connected between the gate of the TFT Q and the voltage supply line PB3. Here, the switches SW1, SW2, SW3 and SW4 are controlled by the control lines CL1, CL2, CL3 and CL4, respectively.

Figure 9:
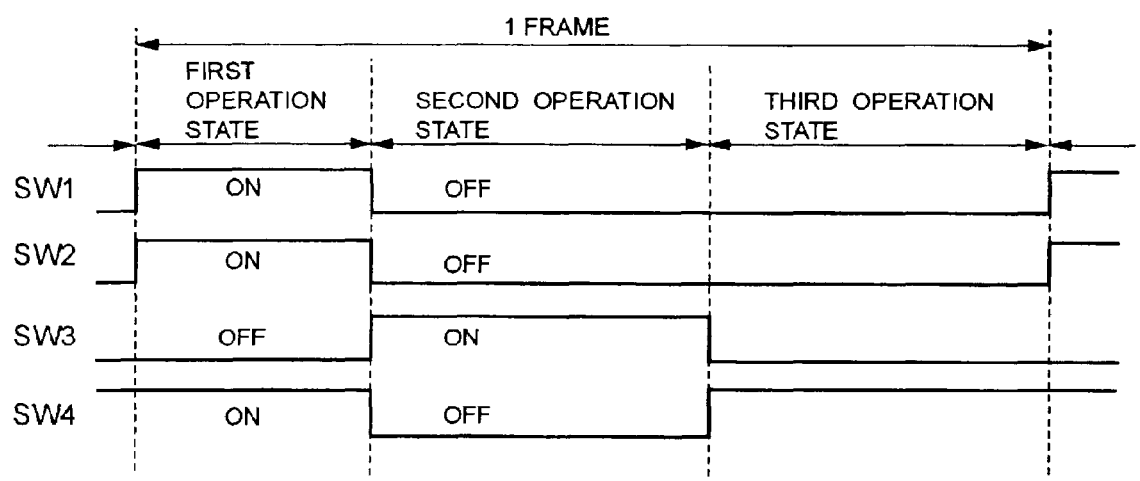
FIG. 9 is a timing chart of an operation example according to the fourth embodiment of this invention.

FIG. 9 is a timing chart of an operation example according to the fourth embodiment of this invention shown in FIG. 8. According to this operation example, in a first operation state (current retaining state or row selection period), the shown pixel is selected, the switch SW1 is turned on by the control line CL1, the switch SW2 is turned on by the control line CL2, and the switches SW3 and SW4 stay of f and on under the action of the control lines CL3 and CL4, respectively. In this state, as in the case of the circuit of the first embodiment, a voltage of the capacitance C and the gate of the TFT Q is set at a value for passing the current supplied through the signal line SL across the drain and source of the TFT Q, and a voltage is applied to one terminal of the light emitting device LED from the voltage supply line PB4 through the switch SW4. The voltage applied to the light emitting device LED from the voltage supply line PB4 should be at a level not causing the light emitting device LED to emit light.

The subsequent second operation state (current supplying state) is a state where a row other than that including the pixel shown in FIG. 8 is selected, in which the switch SW1 is turned off by the control line CL1, the switch SW2 is turned off by the control line CL2, the switch SW3 is turned on by the control line CL3, and the switch SW4 is turned off by the control line CL4.

In this state, the gate voltage of the TFT Q is identical to that retained by the capacitance element C in the first operation state, and the TFT Q supplies the current supplied thereto from the signal line SL in the first operation state to the light emitting device LED to cause the light emitting device LED to emit light with a brightness at an intended gray-scale level.

In the subsequent third operation state (current stop state), the row other than that including the shown pixel has been selected, and the switch SW3 is turned off by the control line CL3 and the switch SW4 is turned on by the control line CL4 before the row including the shown pixel is selected again. Thus, the supply of the current to the light emitting device LED is stopped, and charges stored in the light emitting device LED are rapidly removed, so that the light emitting device LED stops the operation thereof (light emission).

This operation example is essentially the same as the third operation example according to the first embodiment shown in FIG. 4. However, since the charges stored in the light emitting device LED are forcedly removed by the action of the switch SW4, the light emission by the light emitting device can be stopped simultaneously with stopping the supply of the current thereto, so that the light emission period of the light emitting device can be controlled with higher precision. Here, for example, the voltage applied from the voltage supply line PB4 may be set at the same value as the voltage applied from the voltage supply line PB1. In such a case, one terminal of the switch SW4 can be connected to the voltage supply line PB1, rather than to the voltage supply line PB4. Then, the voltage supply line PB4 is not necessary, so that the configuration of the pixel 2 can be simplified.

In the operation example shown in FIG. 9, while the switches SW3 and SW4 are reverse-acting switches in the operation example shown in FIG. 9, a modification can be made to the switch SW4 so that it stays on only for a certain period from the beginning of the third operation state.

Furthermore, in the fourth embodiment, an operation similar to the second and third operation examples in the first embodiment are possible.

Not only the first embodiment, but also each the second and third embodiment performs an operation as that of the fourth embodiment by adding the fourth switch and the fourth control line in the fourth embodiment thereto, respectively. In such cases, the light emission time of the light emitting device can be controlled more accurately without loss of the advantages inherent in the embodiments and there respective operations.

As described in detail with regard to the first embodiment, for the operations in the first to fourth embodiments, the configuration of the pixel 2 can be simplified by appropriately selecting the types of conductivity of the transistors and integrating the control lines. Furthermore, for example, the configuration of the pixel can be simplified by connecting a terminal of the capacitance element C on the other side of the retaining node to the voltage supply line PB1 or PB2, so that the voltage supply line PB3 can be removed. Besides, the value of the voltage applied to the voltage supply line PB3 in the first and second operation state can be changed to change the current supplied to the light emitting device. For example, if the voltage applied to the voltage supply line PB3 in the second operation state is shifted from the voltage value in the first operation state to a level that causes the TFT Q to be turned off, the gate voltage of the TFT Q is also shifted by the same amount on a boot effect, and thus, the current can be prevented from flowing. Thus, a black state can be readily inserted for improving the moving images display.

EXAMPLES

Now, examples of the present invention will be described in detail with reference to the drawings. In the following, the description will be made with regard to a light emitting device. However, it is illustrative only, and this invention can be applied to any typical current load element.

First Example

Figure 10:
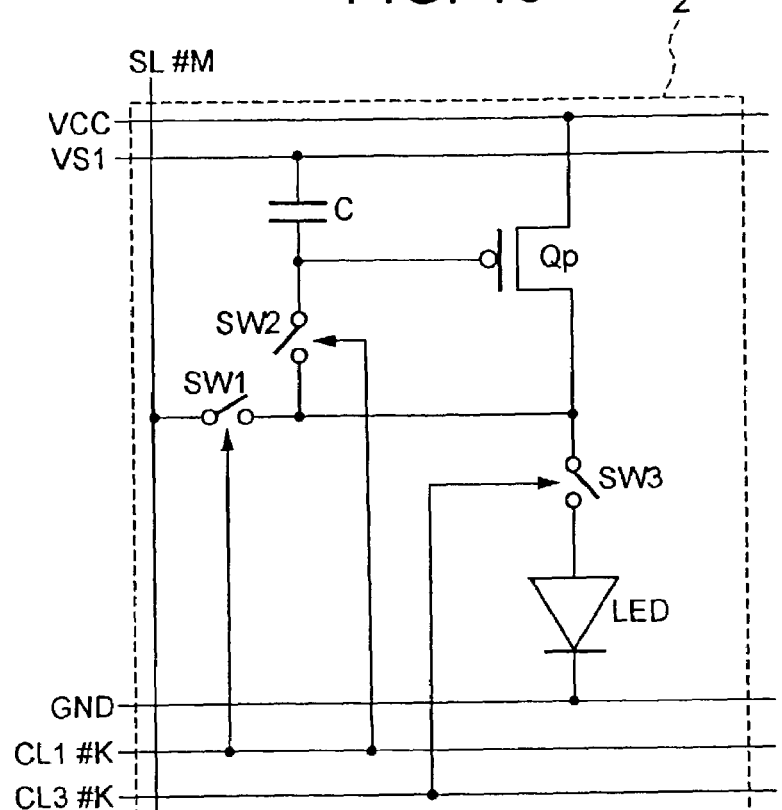
FIG. 10 is a diagram showing a configuration of a pixel according to the first example of this invention.
Figure 37:
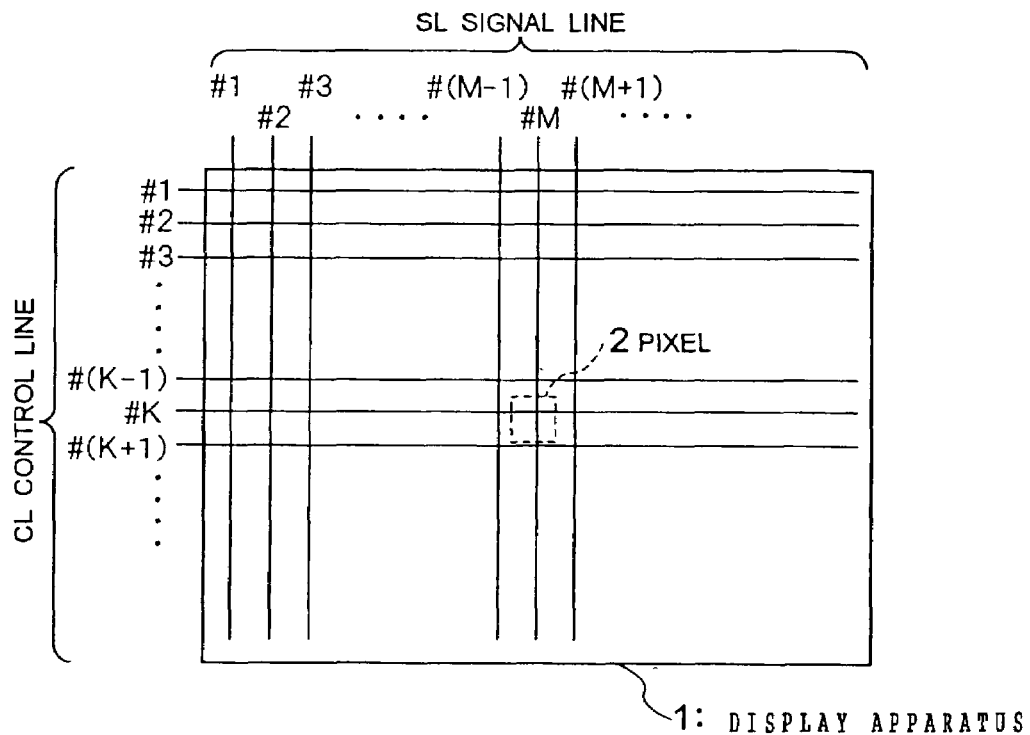
FIG. 37 is a schematic plan view of a display apparatus of a light emitting display device.
Figure 38:
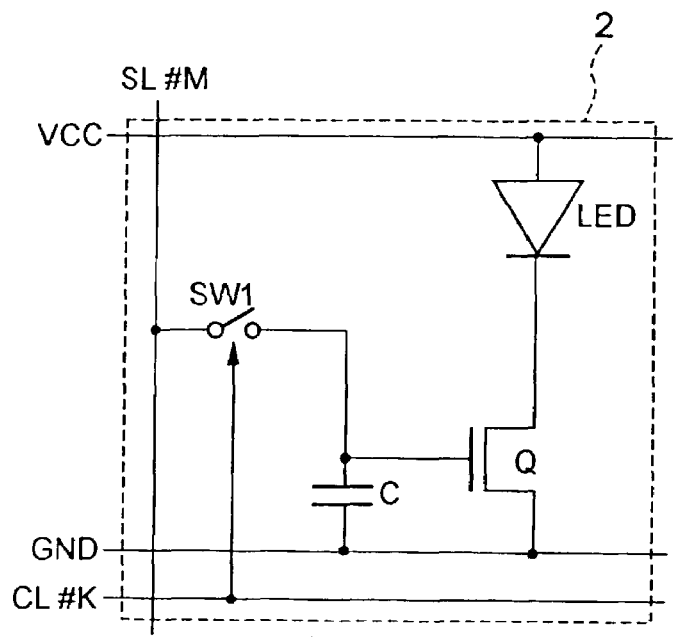
FIG. 38 is a diagram showing a configuration of a pixel according to a first conventional example.
Figure 39:
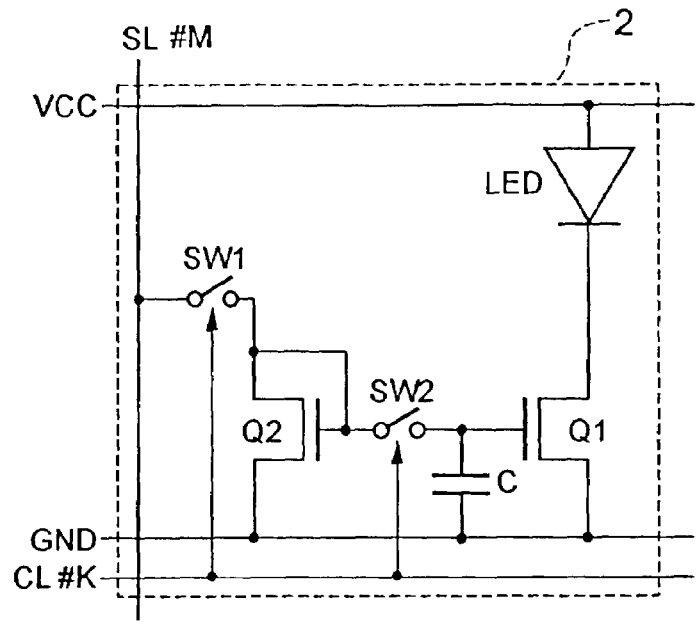
FIG. 39 is a diagram showing a configuration of a pixel according to a second conventional example.
Figure 40:
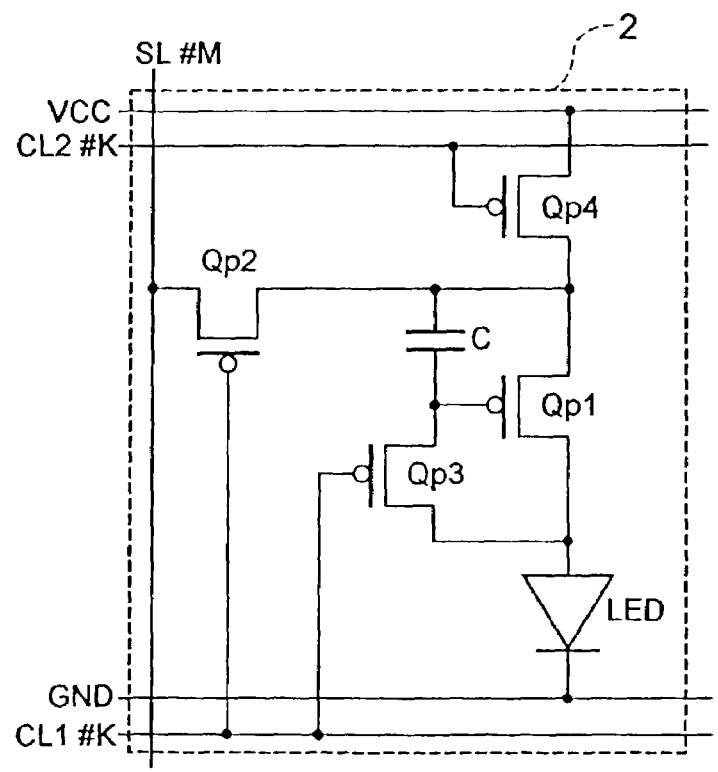
FIG. 40 is a diagram showing a configuration of a pixel according to a third conventional example.

FIG. 10 shows a configuration of one pixel according to a first example of this invention. Here, all the pixels in the following examples are the pixel located in the Kth row and Mth column in the display apparatus shown in FIG. 37. A signal line SL (#M), a power supply line VCC, a ground line GND, a voltage supply line VS1, a control line CL1 (#K) and a control line CL3 (#K) run through a pixel 2 according to the first example of this invention, and a p-TFT Qp, switches SW1 to SW3, a capacitance element C and a light emitting device LED are arranged in the pixel 2. The source of the p-TFT Qp is connected to the power supply line VCC, and the drain thereof is connected to one end each of the switches SW1 to SW3, respectively. The other end of the switch SW1 is connected to the signal line SL (#M), the other end of the switch SW2 is connected to the gate of the p-TFT Qp, and the other end of the switch SW3 is connected to an anode of the light emitting device LED. The switches SW1 and SW2 are controlled by a signal in the control line CL1 (#K), and the switch SW3 is controlled by a signal in the control line CL3 (#K). A cathode of the light emitting device LED is connected to the ground line GND, and one end of the capacitance element C is connected to the gate of the p-TFT Qp and the other end thereof is connected to the voltage supply line VS1. The voltage of the voltage supply line VS1 should be kept constant.

Figure 11:
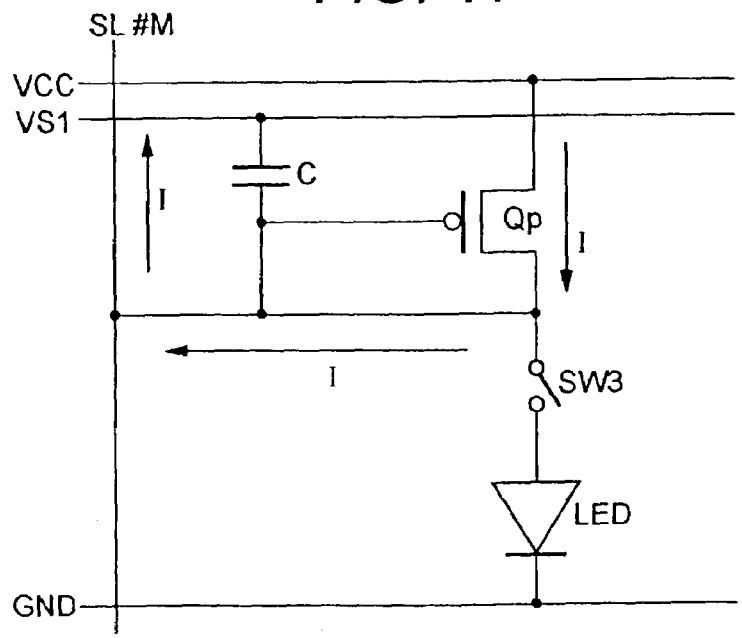
FIG. 11 is a (first) diagram for illustrating an operation according to the first example of this invention.
Figure 12:
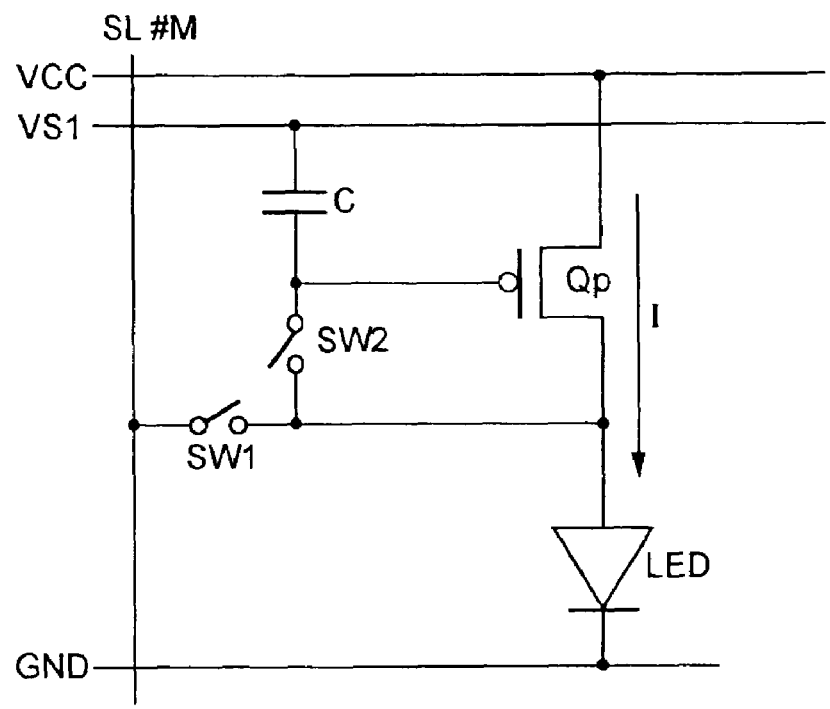
FIG. 12 is a (second) diagram for illustrating an operation according to the first example of this invention.
Figure 13:
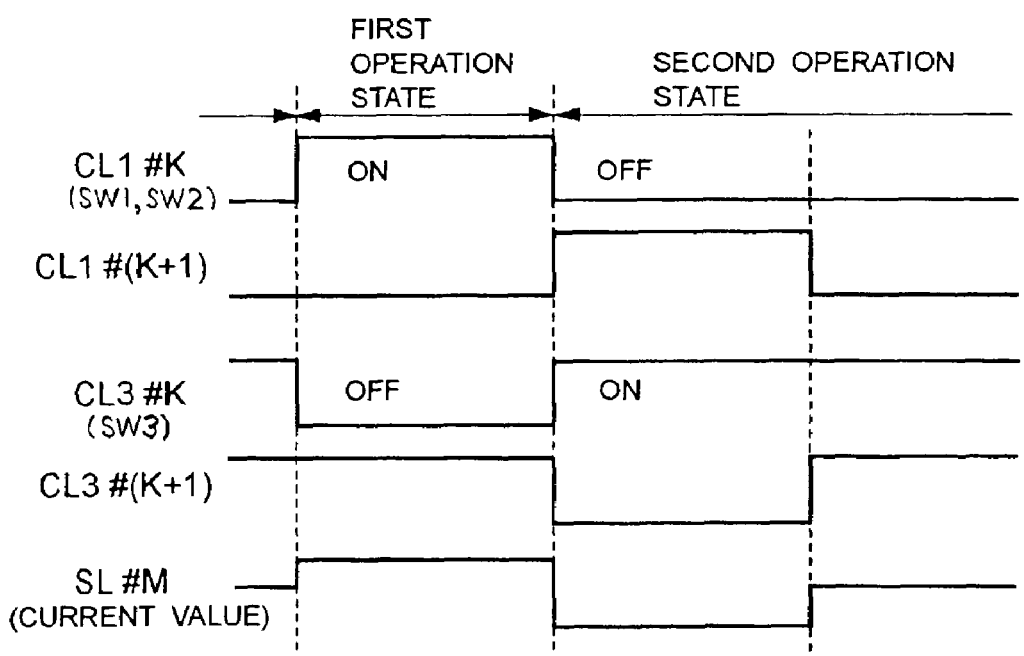
FIG. 13 is a timing chart of an operation according to the first example of this invention.

An operation according to this example will be described below. FIG. 11 shows a first operation state in this example, FIG. 12 shows a second operation state, and FIG. 13 is a timing chart of the operation.

The first operation state (current retaining state or row selection period) in this operation example is a state where the Kth row in the display device is selected, in which the switches SW1 and SW2 are turned on by the control line CL1 (#K), and the switch SW3 is turned off by the control line CL3 (#K). Besides, a current for providing an intended gray-scale is supplied to the signal line SL (#M) based on the current-brightness characteristic of the light emitting device LED. That is, as shown in FIG. 11, a current I flows from the power supply line VCC to the signal line SL (#M) through the p-TFT Qp.

In the first operation state, the p-TFT Qp operates in the saturation region because the drain and the gate thereof is short-circuited by the switch SW2. Besides, since the switch SW3 has been turned off, any current does not flow through the light emitting device LED, and the light emitting device LED does not operate (emit light). The current supplied from the signal line SL (#M) flows into the p-TFT Qp, and depending on the current/voltage characteristics of the p-TFT Qp, the gate voltage of the p-TFT Qp is set at a value for passing the current across the drain and source thereof. At this time, the capacitance of the light emitting device LED is independent of the operation of passing the current through the p-TFT Qp, and needs not to be charged or discharged by the current from the signal line SL (#M). Thus, the gate voltage of the p-TFT Qp is quickly set.

The second operation state (current supplying state) in this example is a state where a row other than the Kth row in the display device is selected, in which the switches SW1 and SW2 are turned off by the signal in the control line CL1 (#K), and the switch SW3 is turned on by the signal in the control line CL3 (#K).

In this operation state, the gate voltage of the p-TFT Qp is held by the capacitance element C at the value in the first operation state, and thus, it is the same as the voltage between the gate and source of the p-TFT Qp in the first operation state. Since the p-TFT Qp supplies the current supplied thereto from the signal line SL (#M) in the first operation state to the light emitting device LED through the switch SW3, the light emitting device LED operates (emits light) to provide a brightness at an intended gray-scale level. That is, at this time, as shown in FIG. 12, the same current I as in the case shown in FIG. 11 flows from the power supply line VCC to the ground line GND through the p-TFT Qp and the light emitting device LED. In this first operation example, the same TFT serves both to retain the current and to supply the current as described above. Therefore, the current can be retained and supplied with high precision.

Second Example

Figure 14:
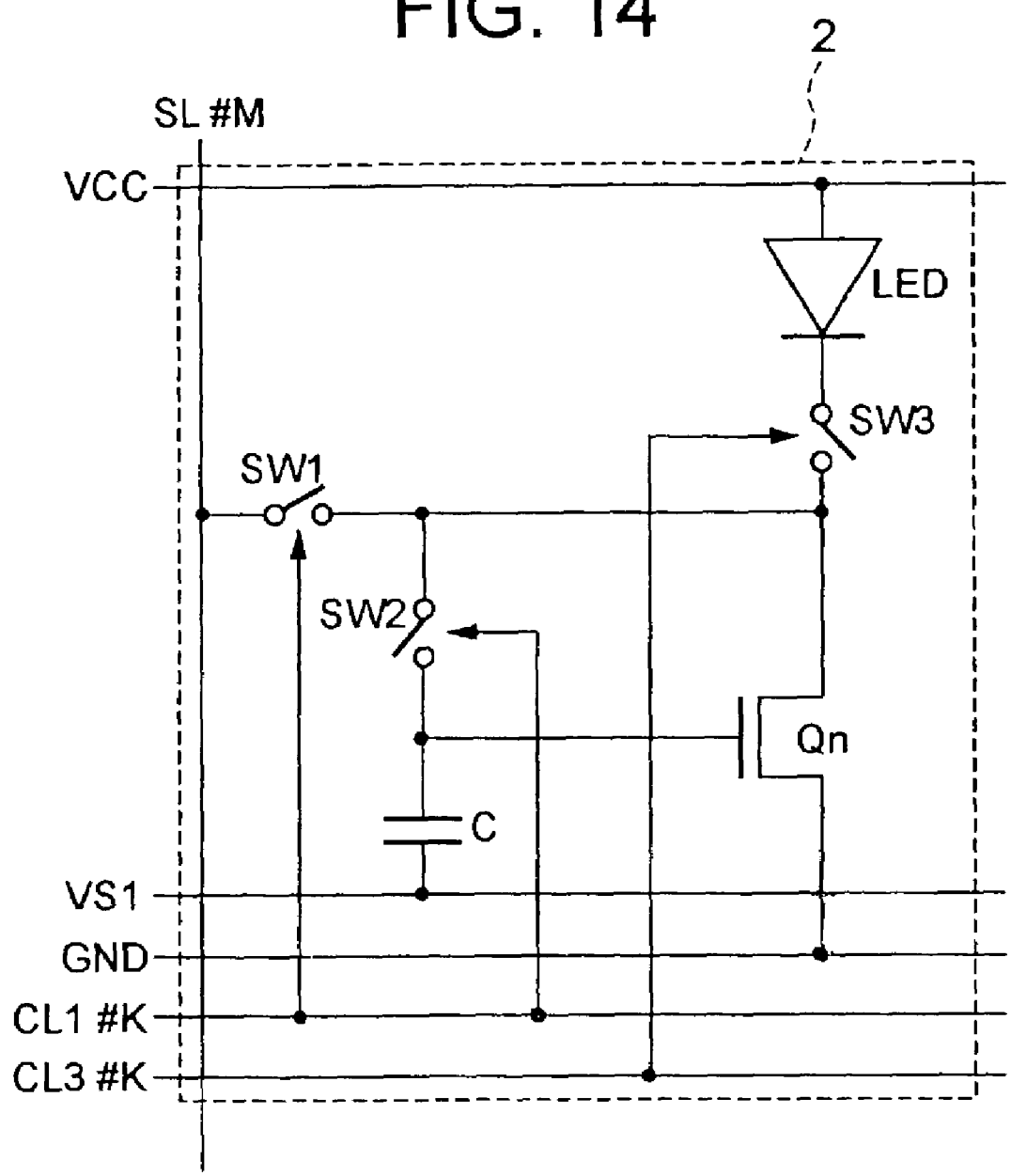
FIG. 14 is a diagram showing a configuration of a pixel according to the second example of this invention.

FIG. 14 is a circuit diagram showing a configuration of one pixel according to a second example of this invention. The second example is the same as the first example except that the channel type of the TFT for supplying the current is changed from the p-channel type to the n-channel type. That is, an n-channel type TFT (n-TFT, hereinafter) is used instead of the p-TFT in the first example. A signal line SL (#M), a power supply line VCC, a ground line GND, a voltage supply line VS1, a control line CL1 (#K) and a control line CL3 (#K) run through a pixel 2 according to the second example of this invention, and an n-TFT Qn, switches SW1 to SW3, a capacitance element C and a light emitting device LED are arranged in the pixel 2. The source of the n-TFT Qn is connected to the ground line GND, and the drain thereof is connected to one end each of the switches SW1 to SW3, respectively. The other end of the switch SW1 is connected to the signal line SL (#M), the other end of the switch SW2 is connected to the gate of the n-TFT Qn, and the other end of the switch SW3 is connected to a cathode of the light emitting device LED. The switches SW1 and SW2 are controlled by a signal in the control line CL1 (#K), and the switch SW3 is controlled by a signal in the control line CL3 (#K). An anode of the light emitting device LED is connected to the power supply line VCC, and one end of the capacitance element C is connected to the gate of the n-TFT Qn and the other end thereof is connected to the voltage supply line VS1. The voltage of the voltage supply line VS1 is kept constant.

In this example, the control timing chart is the same as that in the first example shown in FIG. 13, and the circuit according to this example operates the same and has the same advantage as in the first example.

Third Example

Figure 15:
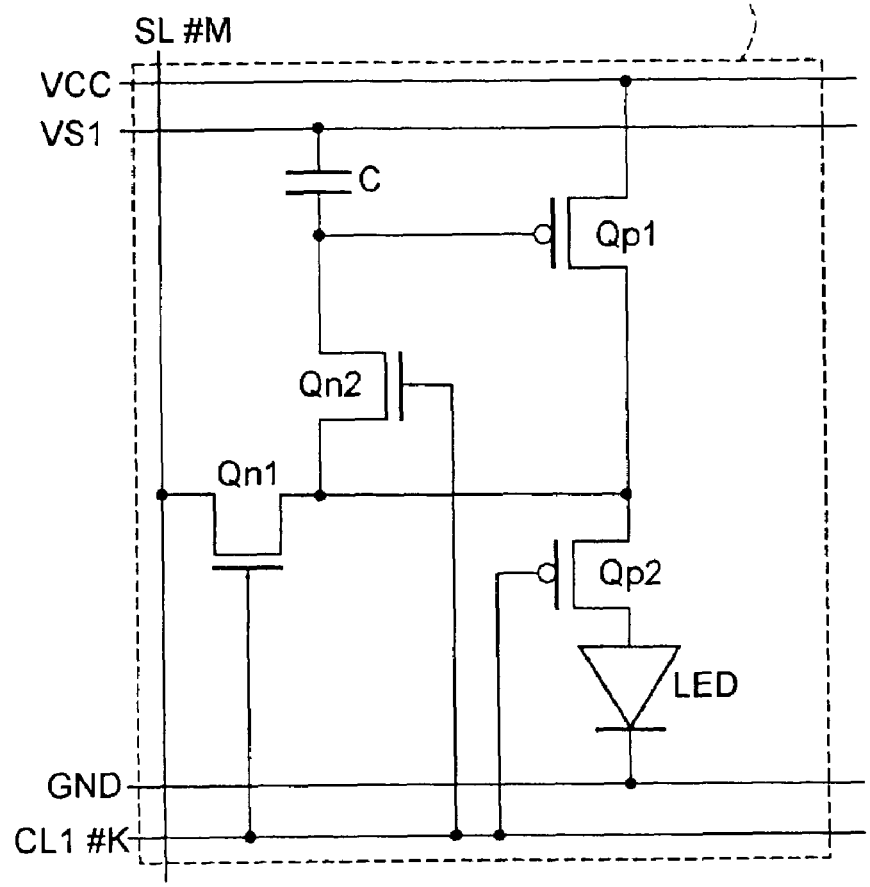
FIG. 15 is a diagram showing a configuration of a pixel according to a third example of this invention.
Figure 16:
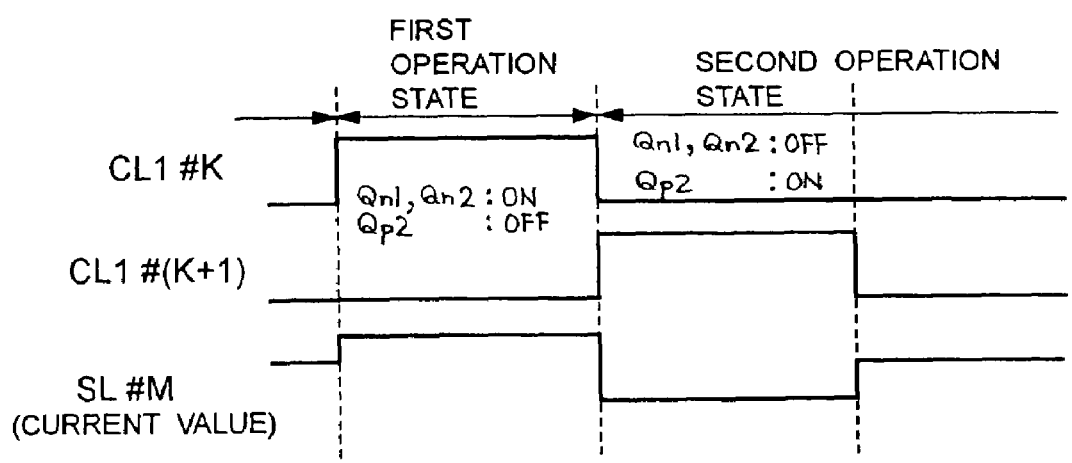
FIG. 16 is a timing chart of an operation according to the third example of this invention.

FIG. 15 is a circuit diagram showing a configuration of a pixel according to a third example of this invention, and FIG. 16 is a timing chart of an operation thereof.

A signal line SL (#M), a power supply line VCC, a ground line GND, a voltage supply line VS1 and a control line CL1 (#K) run through a pixel 2 according to this example, and a p-TFT Qp1, a p-TFT Qp2, an n-TFT Qn1, an n-TFT Qn2, a capacitance element C and a light emitting device LED are arranged in the pixel 2. In this example, the n-TFT Qn1, the n-TFT Qn2 and the p-TFT Qp2 serve as the switches SW1, SW2 and SW3 in the first example, respectively (the p-TFT Qp1 serves as the p-TFT Qp in the first example). The operation according to the timing chart shown in FIG. 16 is the same as in the first example. According to the arrangement in this example, the control lines can be united into one.

Fourth Example

Figure 17:
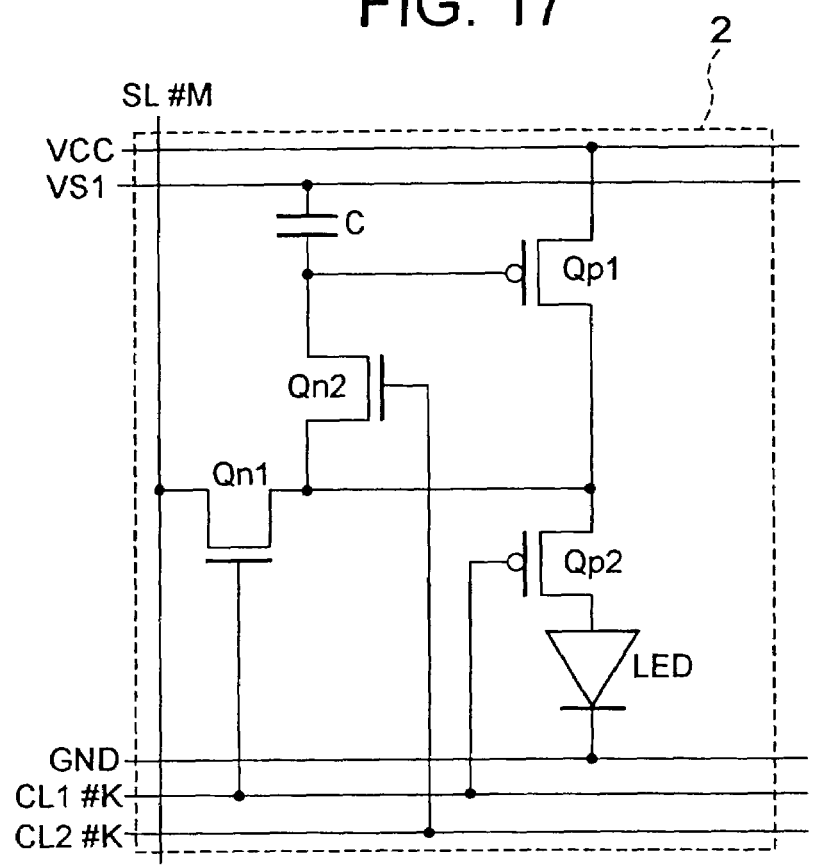
FIG. 17 is a diagram showing a configuration of a pixel according to the fourth example of this invention.
Figure 18:
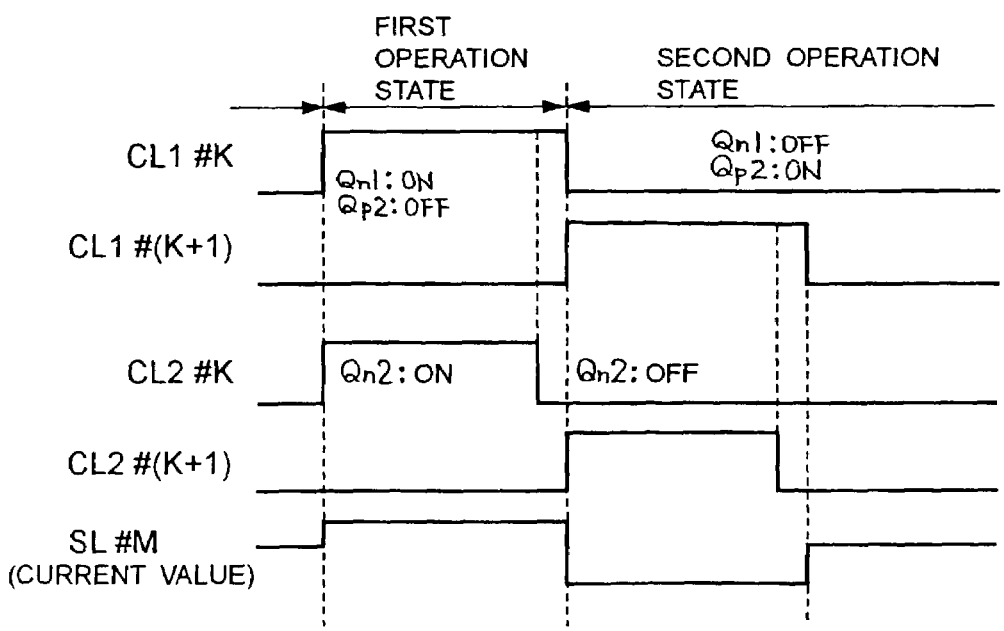
FIG. 18 is a timing chart of an operation according to the fourth example of this invention.

FIG. 17 is a circuit diagram showing a configuration of a pixel according to a fourth example of this invention, and FIG. 18 is a timing chart of an operation thereof.

A signal line SL (#M), a power supply line VCC, a ground line GND, a voltage supply line VS1, a control line CL1 (#K) and a control line CL2 (#K) run through a pixel 2 according to this example, and a p-TFT Qp1, a p-TFT Qp2, an n-TFT Qn1, an n-TFT Qn2, a capacitance element C and a light emitting device LED are arranged in the pixel 2. This example is different from the third example in that the control line CL2 (#K) is additionally provided and the gate of the n-TFT Qn2 is controlled by the control line CL2 (#K). The operation according to the timing chart shown in FIG. 18 is essentially the same as in the third example (see FIG. 16). In this example, however, as shown in the timing chart shown in FIG. 18, the n-TFT Qn2 is turned off earlier by the control line CL2 (#K), and then, the p-TFT Qp2 is turned on and the n-TFT Qn1 is turned off by the control line CL1 (#K). According to such an operation, a noise caused by the on/off operation of the p-TFT Qp2 and n-TFT Qn1 can be prevented from being transmitted to the gate of the p-TFT Qp1. Thus, a more precise current can be supplied to the light emitting device LED from the p-TFT Qp1.

Fifth Example

Figure 19:
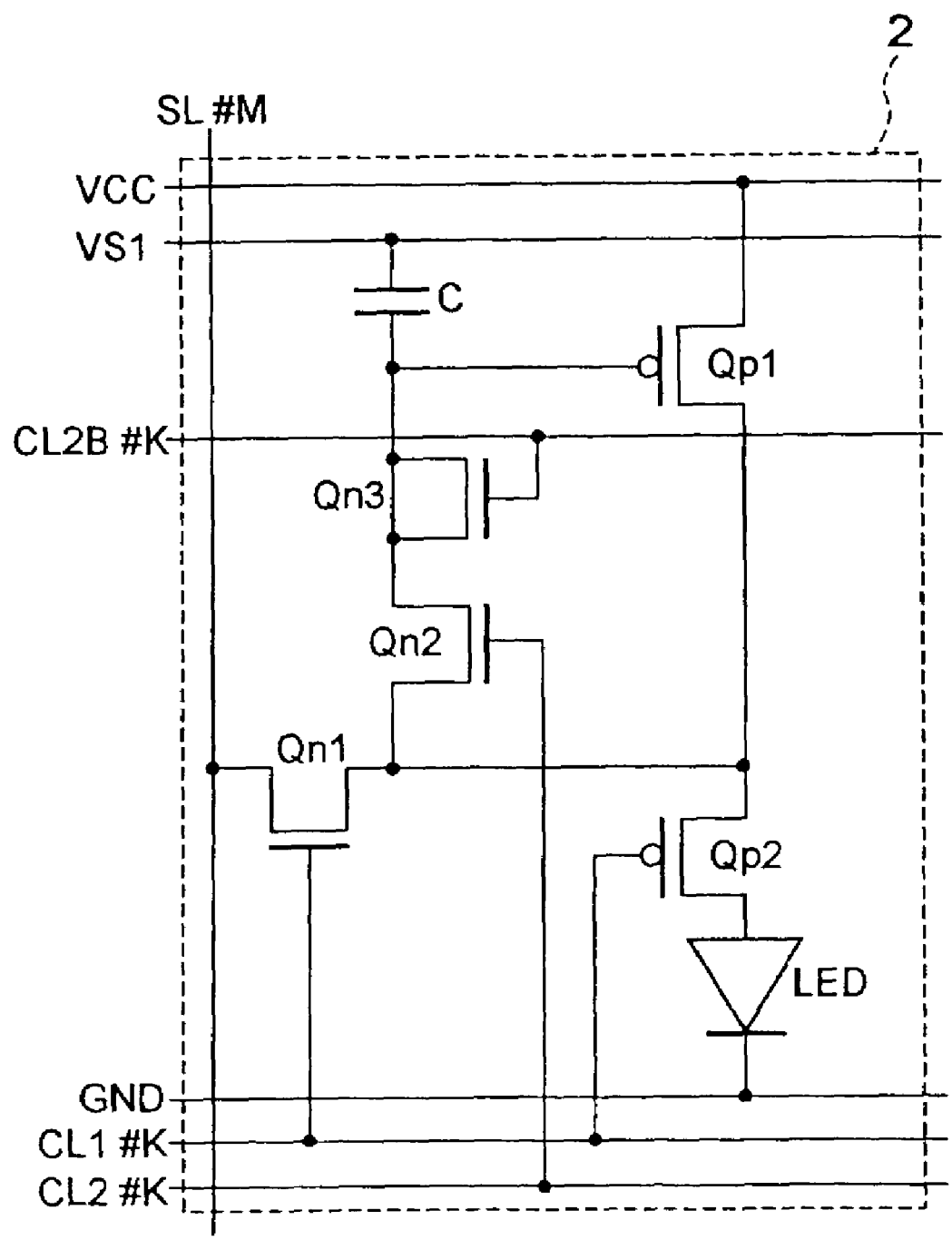
FIG. 19 is a diagram showing a configuration of a pixel according to the fifth example of this invention.
Figure 20:
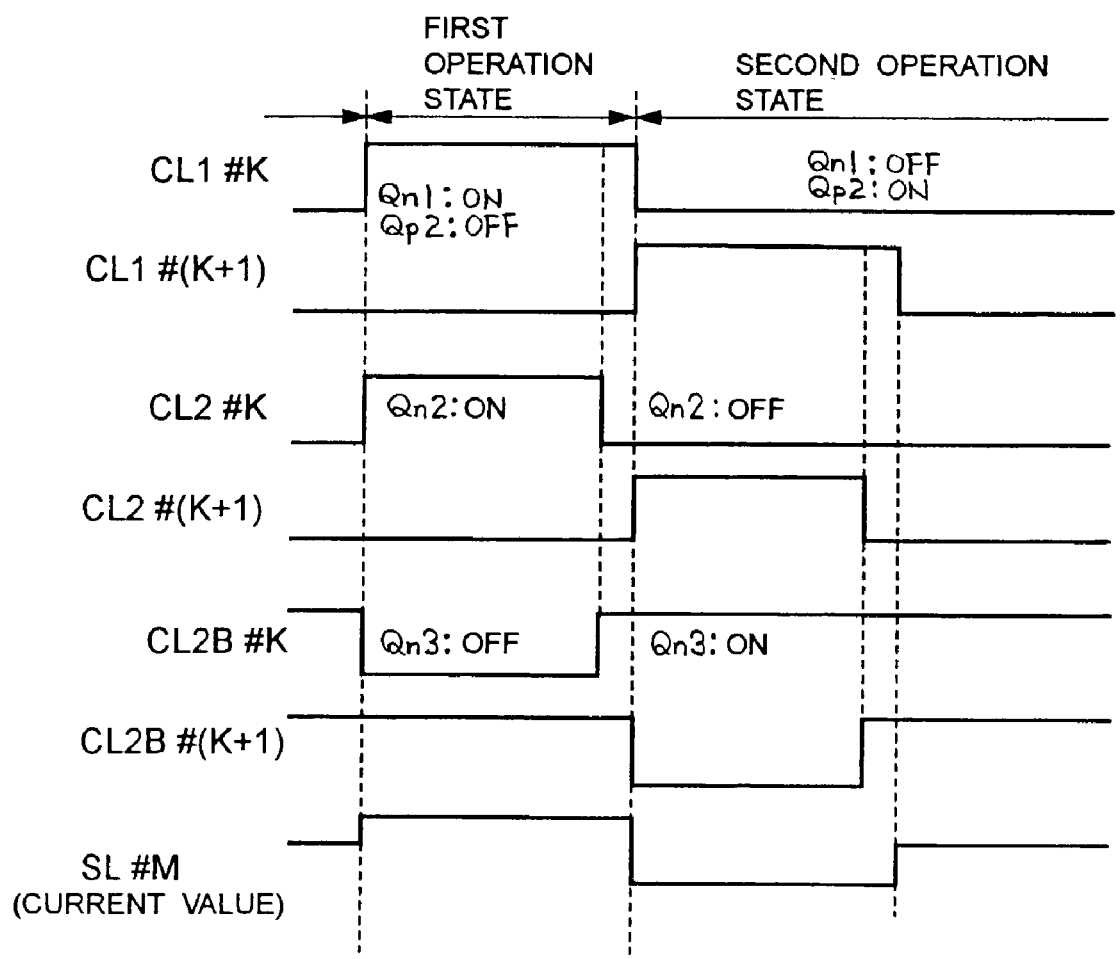
FIG. 20 is a timing chart of an operation according to the fifth example of this invention.

FIG. 19 is a circuit diagram showing a configuration of a pixel according to a fifth example of this invention, and FIG. 20 is a timing chart of an operation thereof.

A signal line SL (#M), a power supply line VCC, a ground line GND, a power supply line VS1, a control line CL1 (#K), a control line CL2 (#K) and a control line CL2B (#K) run through a pixel 2 according to this example, and a p-TFT Qp1, a p-TFT Qp2, an n-TFT Qn1, an n-TFT Qn2, an n-TFT Qn3, a capacitance element C and a light emitting device LED are arranged in the pixel 2. This example is different from the fourth example (see FIG. 17) in that the control line CL2B (#K) and the n-TFT Qn3 controlled by the control line CL2B (#K) are additionally provided. The n-TFT Qn3 has the source and the drain short-circuited and an appropriate ratio (W/L) between a gate length (L) and gate width (W) thereof with respect to the ratio of the n-TFT Qn2, and is connected between the gate of the p-TFT Qp1 and the drain (or source) of then-TFT Qn2. Since the n-TFT Qn2 has a capacitance (capacitance between the gate and the drain (or source)), when the n-TFT Qn2 is shifted from the on state to the off state, the charges stored therein are moved and the gate potential of the p-TFT Qp1 is disturbed. The n-TFT Qn3 is intended to cancel the movement of the charges for compensating for a voltage error at the gate of the p-TFT Qp1. And, the n-TFT Qn3 has a capacitance equivalent to that between the gate and the drain (or source) of the n-TFT Qn2, and is controlled by the control line CL2B (#K) that carries an inversion signal of the signal in the control line CL2 (#K) for the n-TFT Qn2. In most cases, the ratio between the gate length and gate width of the n-TFT Qn3 is set at one half of that of the n-TFT Qn2. However, the ratio may vary with a timing condition or the like. According to this example including the n-TFT Qn3, a more precise current can be supplied to the light emitting device LED from the p-TFT Qp1.

Sixth Example

A sixth example is equivalent to the third example (see FIG. 15) having the channel types of all the TFTs being inverted. Therefore, the operation timing chart in this example is equivalent to that in the third example shown in FIG. 16 having the signals of the control lines CL1 (#K) and CL1 (#(K+1)) being inverted.

Seventh Example

A seventh example is equivalent to the fourth example (see FIG. 17) having the channel types of all the TFTs being inverted. Therefore, the operation timing chart in this example is equivalent to that in the fourth example shown in FIG. 18 having the signals of the control lines CL1 (#K), CL1 (#(K+1)), CL2 (#K) and CL2 (#(K+1)) being inverted.

Eighth Example

An eighth example is equivalent to the fifth example (see FIG. 19) having the channel types of all the TFTs being inverted. Therefore, the operation timing chart in this example is equivalent to that in the fifth example shown in FIG. 20 having the signals of the control lines CL1 (#K), CL1 (#(K+1)), CL2 (#K), CL2 (#(K+1)), CL2B (#K) and CL2B (#(K+1)) being inverted.

Ninth Example

Figure 21:
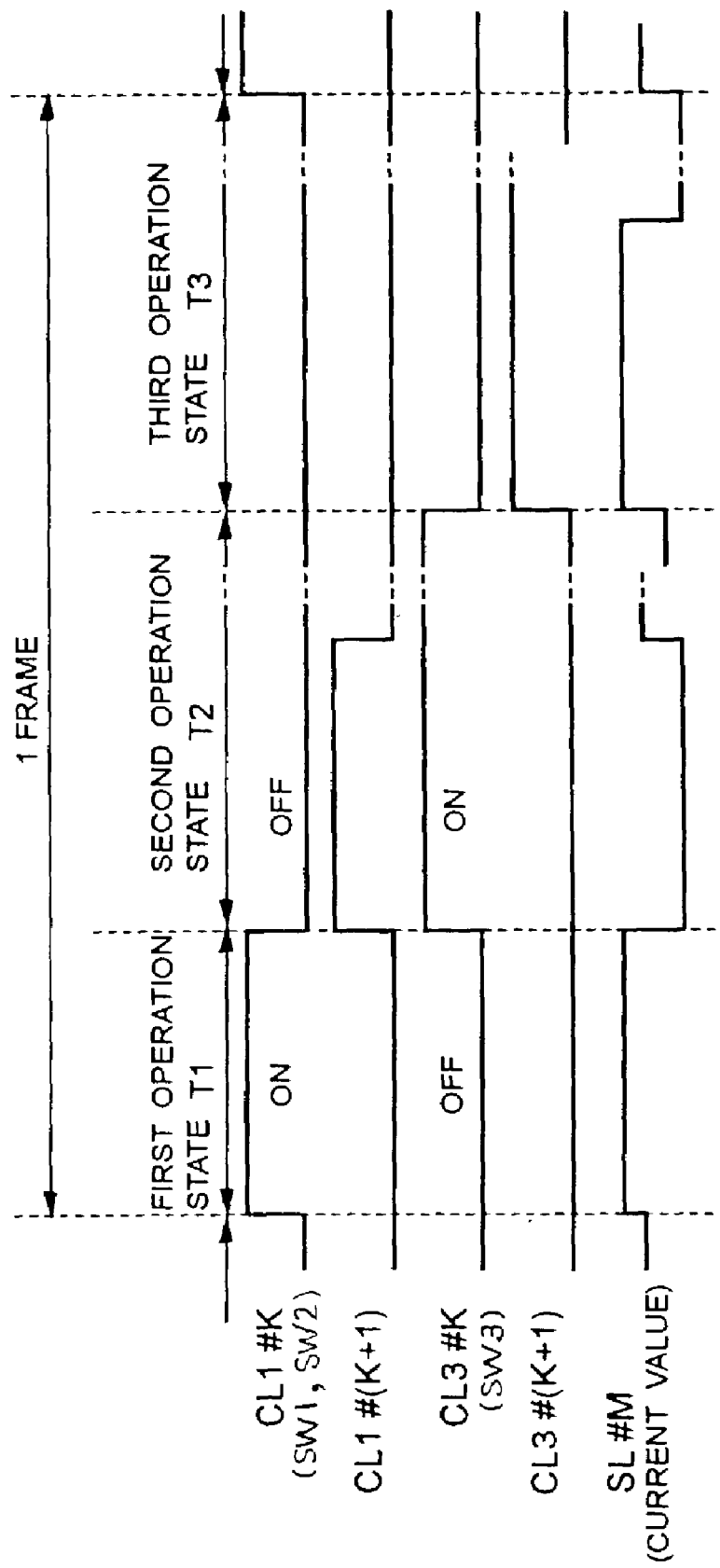
FIG. 21 is a timing chart of an operation according to a ninth example of this invention.

FIG. 21 is a timing chart of an operation according to a ninth example of this invention. The configuration of the pixel of the display device used in this example is the same as that in the first example shown in FIG. 10.

The first operation state (current retaining state or row selection period) in this example is a state where the Kth row in the display device is selected, in which the switches SW1 and SW2 are turned on by the control line CL1 (#K), and the switch SW3 is turned off by the control line CL3 (#K). Besides, a current for providing an intended gray-scale is supplied to the signal line SL (#M) based on the current-brightness characteristic of the light emitting device LED.

The operation in the first operation state is the same as that in the first example described with reference to FIGS. 10 to 13, and therefore, detailed description thereof is omitted.

The second operation state (current supplying state) in this example is a state where a row other than the Kth row in the display device is selected, in which the switches SW1 and SW2 are turned off by the control line CL1 (#K), and the switch SW3 is turned on by the control line CL3 (#K).

In the second operation state, the gate voltage of the p-TFT Qp is held by the capacitance element C at the value in the first operation state, and thus, the voltage across the gate and source of the p-TFT Qp is the same as that in the first operation state. Since the p-TFT Qp supplies the current supplied thereto from the signal line SL (#M) in the first operation state to the light emitting device LED through the switch SW3, the light emitting device LED operates (emits light) to provide a brightness at an intended gray-scale level.

The third operation state (current stop state) in this example corresponds to a part of the period of the second operation state before entering into the first operation state, in which the switch SW3 is turned off by the control line CL2 (#K) while the switches SW1 and SW2 are held in the off state by the control line CL1 (#K). During the period, since the switch SW3 is in the off state, any current is not supplied to the light emitting device LED, and the light emitting device LED does not operate (emit light).

According to this example, in addition to the advantages of the capability of quickly retaining a current and supplying the retained current to the light emitting device LED with high precision, which are attained by the first to eighth examples, the following advantage can be expected. In this example, among the first to third operation states, the light emitting device LED emits light in the second operation state, stops light emission for a short while in the first operation state and does not emit light in the third operation state. Therefore, the time-average brightness of the display device is T2/(T1+T2+T3) times the brightness in the second operation state, where T1 denotes a period of the first operation state, T2 denotes a period of the second operation state and T3 denotes a period of the third operation state. Assuming that one frame period, which is the product of the selection time and the number of stages (rows) to be controlled, is denoted by T, and T1=0.005T, T2=0.25T and T3=0.745T, for example, the brightness of the display device is 0.25 times the brightness in the second operation state. Accordingly, the brightness of the light emitting device LED in the second operation state is required to be about four times higher than that in the second operation state of the examples not having third operation state. If the current-brightness characteristic of the light emitting device LED exhibits a proportionality, the four times larger current is needed. According to this example, due to the presence of the third operation state, the current passing through the light emitting device LED can be larger compared with the other examples. Thus, a time required for charging a wiring capacitance such as signal line can be reduced, and the period of the first operation state required for retaining the current can be shortened. Therefore, this example is ready for the increase in wiring capacitance and the reduction of the selection time due to higher definition and larger screen. In addition, since the light emitting device LED does not emit light in the third operation state in this example, the display operation is similar to that of CRTs and an afterimage is hard to remain, and thus, moving images can be displayed with high quality.

Tenth Example

Figure 22:
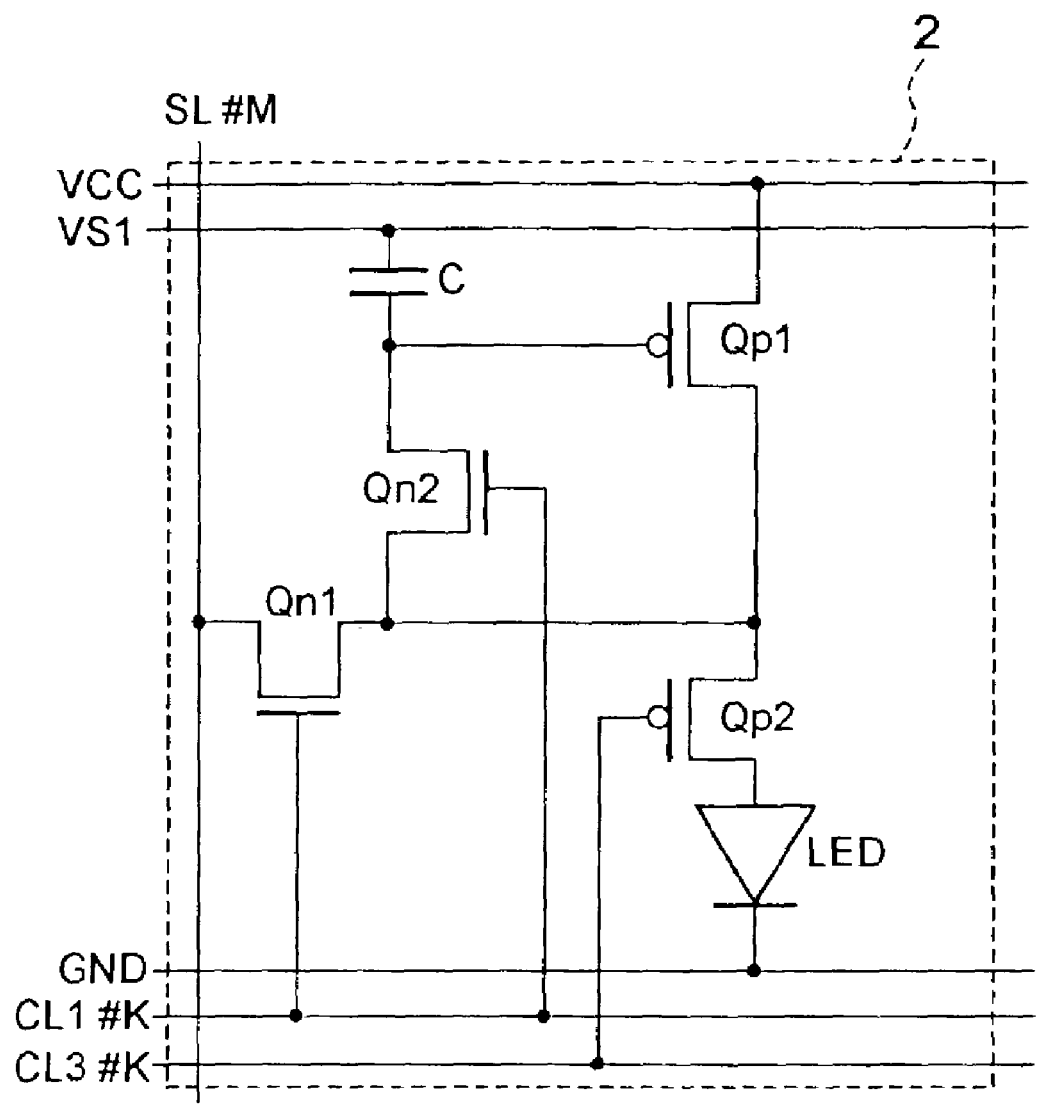
FIG. 22 is a diagram showing a configuration of a pixel according to the tenth example of this invention.
Figure 23:
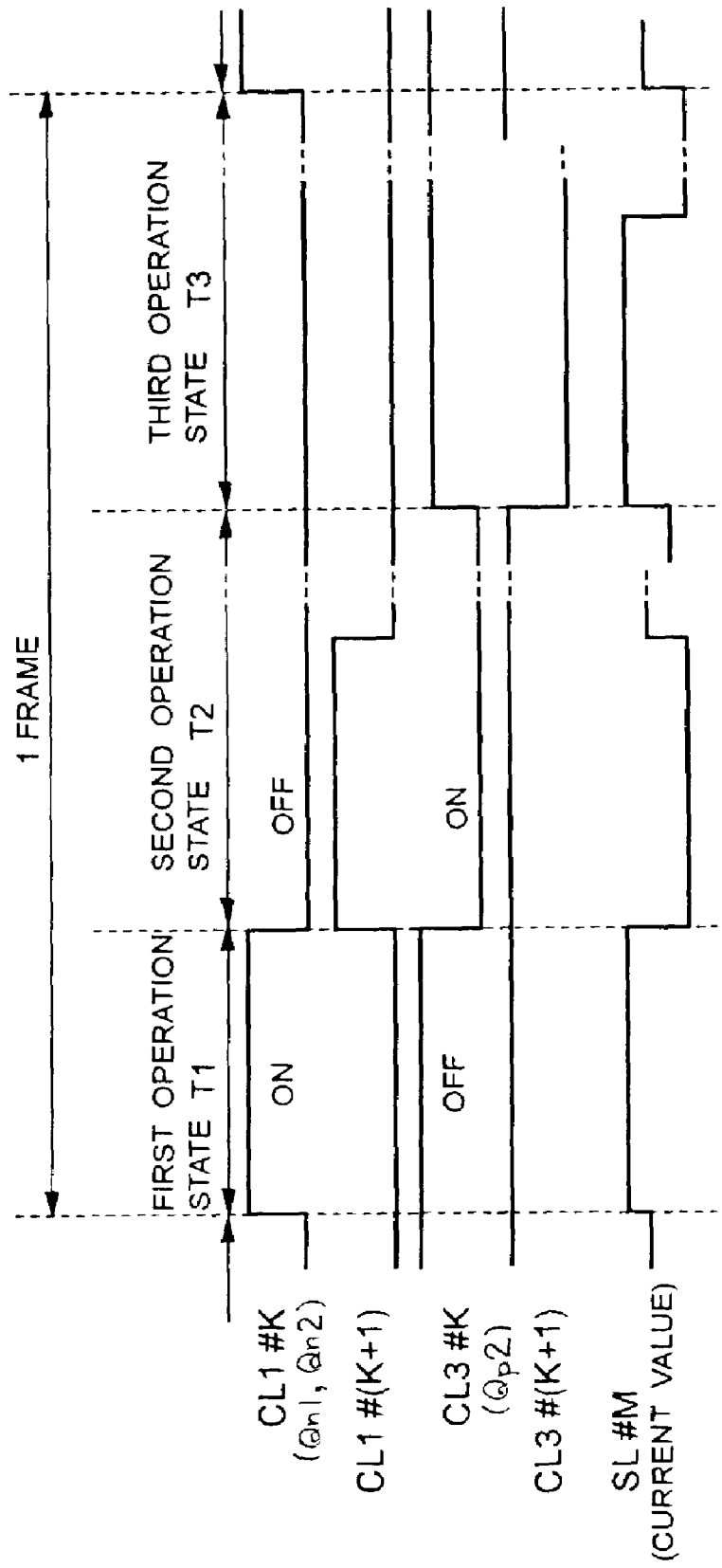
FIG. 23 is a timing chart of an operation according to the tenth example of this invention.

FIG. 22 is a circuit diagram showing a configuration of a pixel according to a tenth example of this invention. A signal line SL (#M), a power supply line VCC, a ground line GND, a voltage supply line VS1, a control line CL1 (#K) and a control line CL3 (#K) run through a pixel 2 according to this example, and a p-TFT Qp1, a p-TFT Qp2, an n-TFT Qn1, an n-TFT Qn2, a capacitance element C and a light emitting device LED are arranged in the pixel 2. The pixel 2 in this example is equivalent to the pixel in the third example (see FIG. 15) additionally having the control line CL3 (#K), which controls the p-TFT Qp2. FIG. 23 is a timing chart of an operation according to this example, which is equivalent to that in the ninth example shown in FIG. 21 having the signals of the control lines CL3 (#K) and CL3 (#(K+1)) being inverted. The circuit in this example operates the same as in the ninth example.

Eleventh Example

Figure 24:
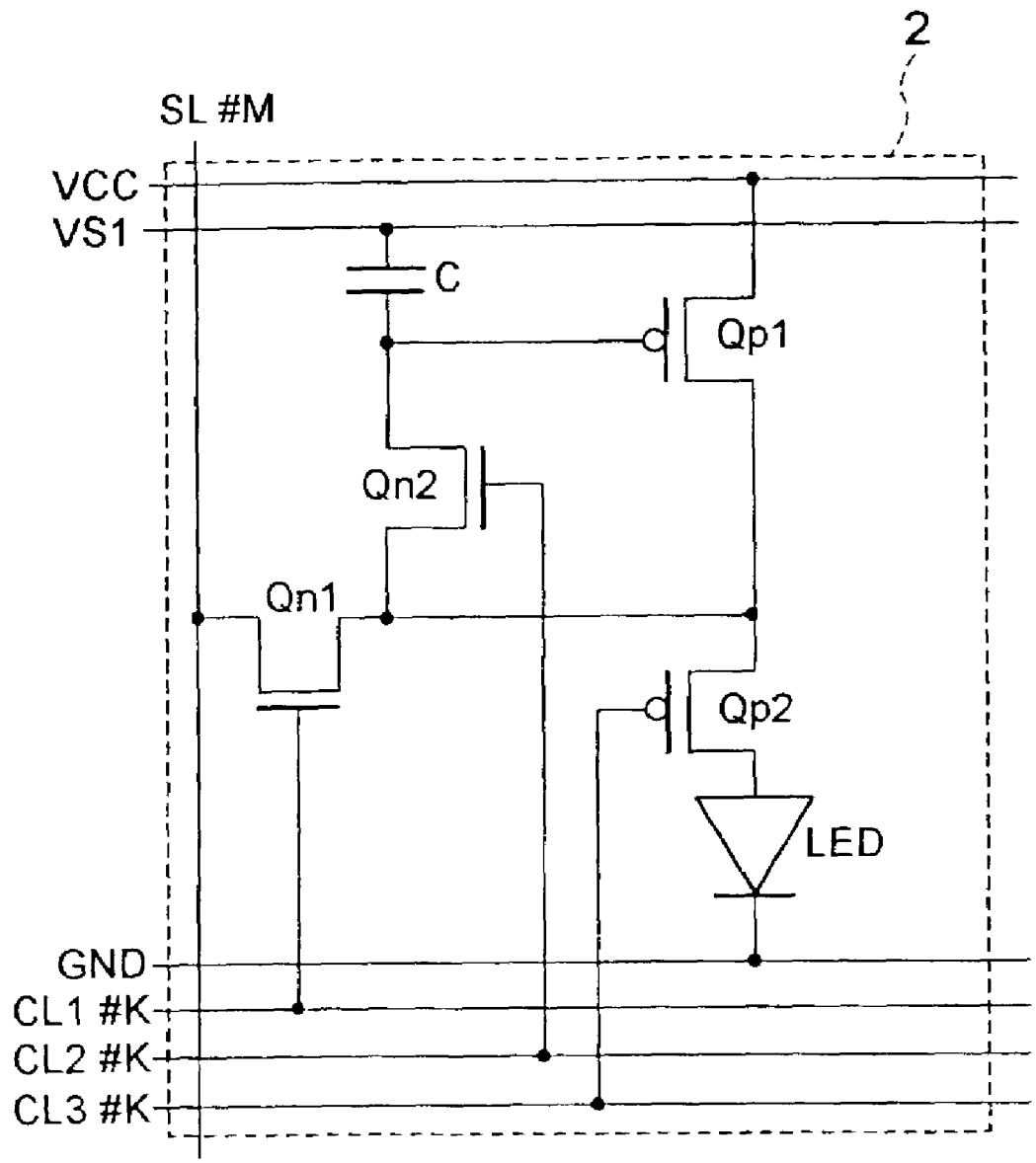
FIG. 24 is a diagram showing a configuration of a pixel according to the eleventh example of this invention.
Figure 25:
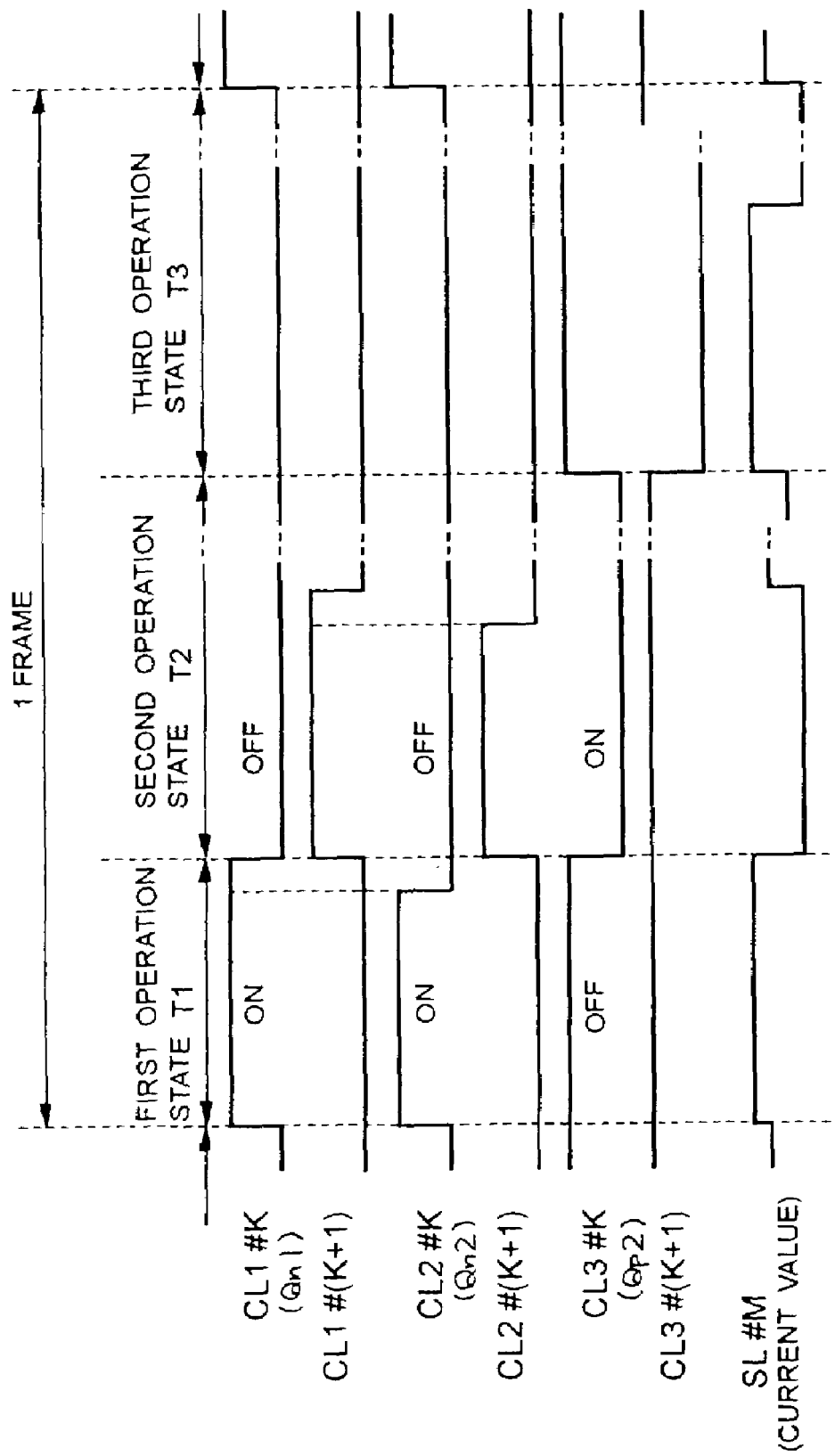
FIG. 25 is a timing chart of an operation according to the eleventh example of this invention.

FIG. 24 is a circuit diagram showing a configuration of a pixel according to an eleventh example of this invention, and FIG. 25 is a timing chart of an operation thereof. A signal line SL (#M), a power supply line VCC, a ground line GND, a voltage supply line VS1, a control line CL1 (#K), a control line CL2 (#K) and a control line CL3 (#K) run through a pixel 2 according to this example, and a p-TFT Qp1, a p-TFT Qp2, an n-TFT Qn1, an n-TFT Qn2, a capacitance element C and a light emitting device LED are arranged in the pixel 2. The pixel 2 in this example is equivalent to the pixel in the tenth example (see FIG. 22) additionally having the control line CL2 (#K), which controls the n-TFT Qn2.

The operation according to the timing chart shown in FIG. 25 is a combination of the operation according to the tenth example shown in FIG. 23 and the operation according to the fourth example shown in FIG. 17. That is, the n-TFT Qn2 is turned off earlier by the control line CL2 (#K), and then, the n-TFT Qn1 is turned off by the control line CL1 (#K) and the p-TFT Qp2 is turned on by the control line CL3 (#K) to prevent a noise caused by the on/off operations of the p-TFT Qp2 and n-TFT Qn1 from being transmitted to the gate terminal of the p-TFT Qp1. Then, the operation shifts to the second operation state, and after that, the third operation state is implemented (the p-TFT Qp2 is turned off).

Twelfth Example

Figure 26:
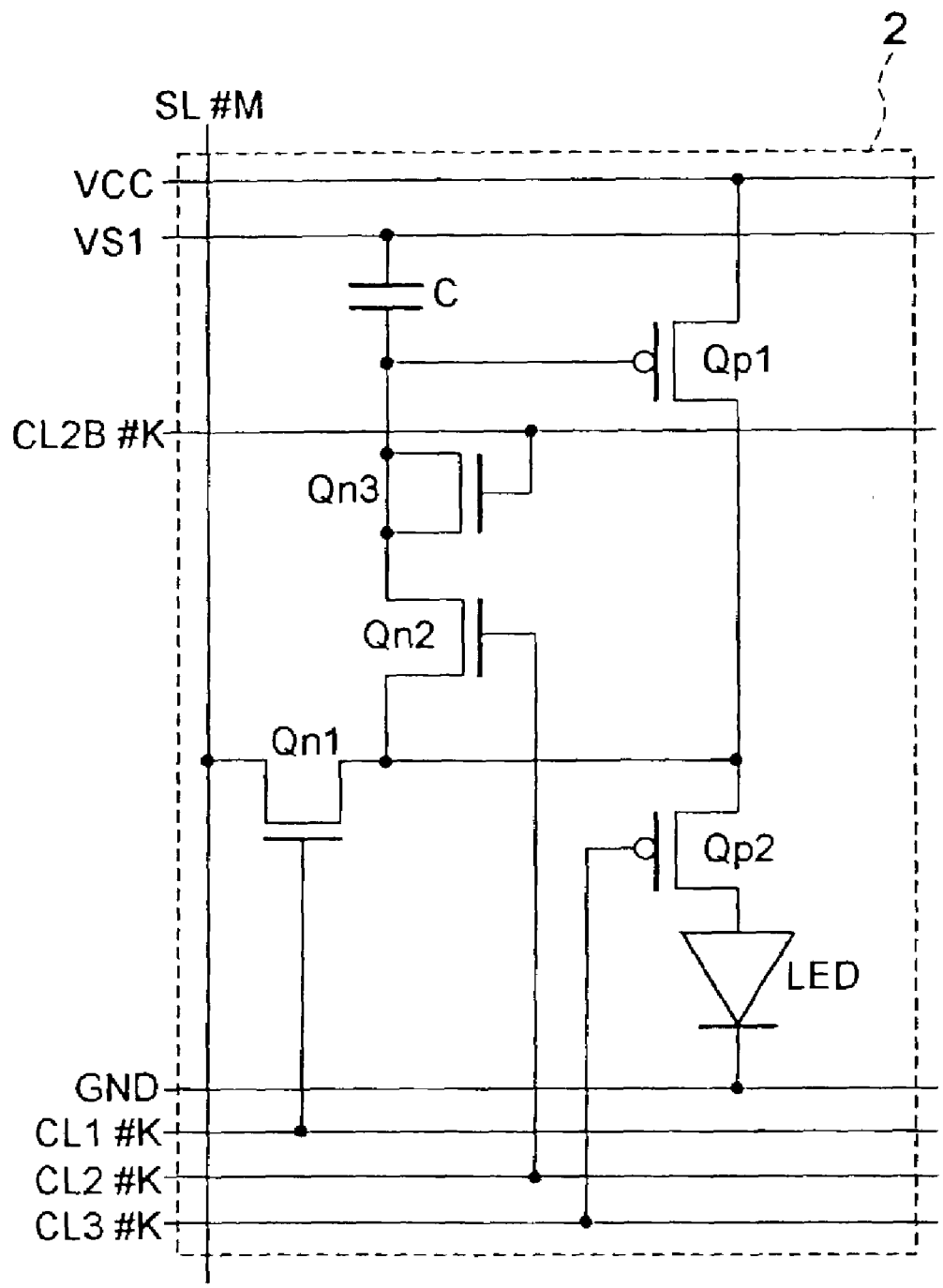
FIG. 26 is a diagram showing a configuration of a pixel according to the twelfth example of this invention.
Figure 27:
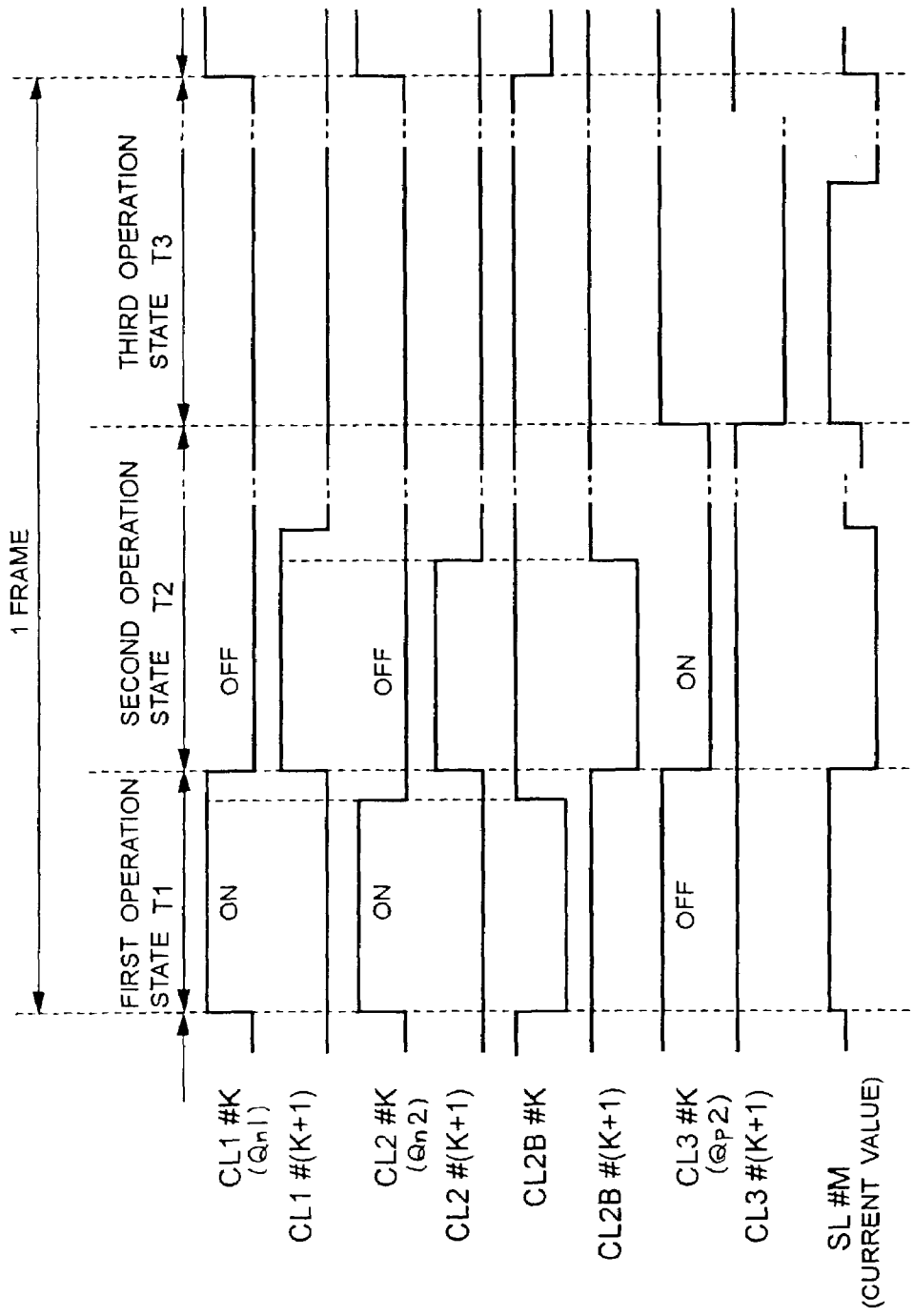
FIG. 27 is a timing chart of an operation according to the twelfth example of this invention.

FIG. 26 is a circuit diagram showing a configuration of a pixel according to a twelfth example of this invention, and FIG. 27 is a timing chart of an operation thereof. A signal line SL (#M), a power supply line VCC, a ground line GND, a voltage supply line VS1, a control line CL1 (#K), a control line CL2 (#K), a control line CL2B (#K) and a control line CL3 (#K) run through a pixel 2 according to this example, and a p-TFT Qp1, a p-TFT Qp2, an n-TFT Qn1, an n-TFT Qn2, an n-TFT Qn3, a capacitance element C and a light emitting device LED are arranged in the pixel 2. The pixel according to this example is equivalent to that in the eleventh example (see FIG. 24) additionally having the control line CL2B (#K) and the n-TFT Qn3 controlled by the control line CL2B (#K), which is a combination of the eleventh example and the fifth example (see FIG. 19).

The operation according to the timing chart shown in FIG. 27 is a combination of the operation according to the eleventh example shown in FIG. 25 and the operation according to the fifth example shown in FIG. 20, which is characterized in that the n-TFT Qn3 absorbs a noise caused by switching of the n-TFT Qn2 controlled by the control line CL2 (#K).

As in the case of the second example for the first example, or the sixth to eighth examples for third to fifth examples, for each of the ninth to twelfth example, alternative examples in which the polarities of the TFTs are changed can be contemplated. In such cases, as in the case of the sixth to eighth examples for third to fifth examples, if the switch TFTs are used, the polarities of the TFTs are changed and the signals of the control lines are inverted.

Thirteenth Example

Figure 28:
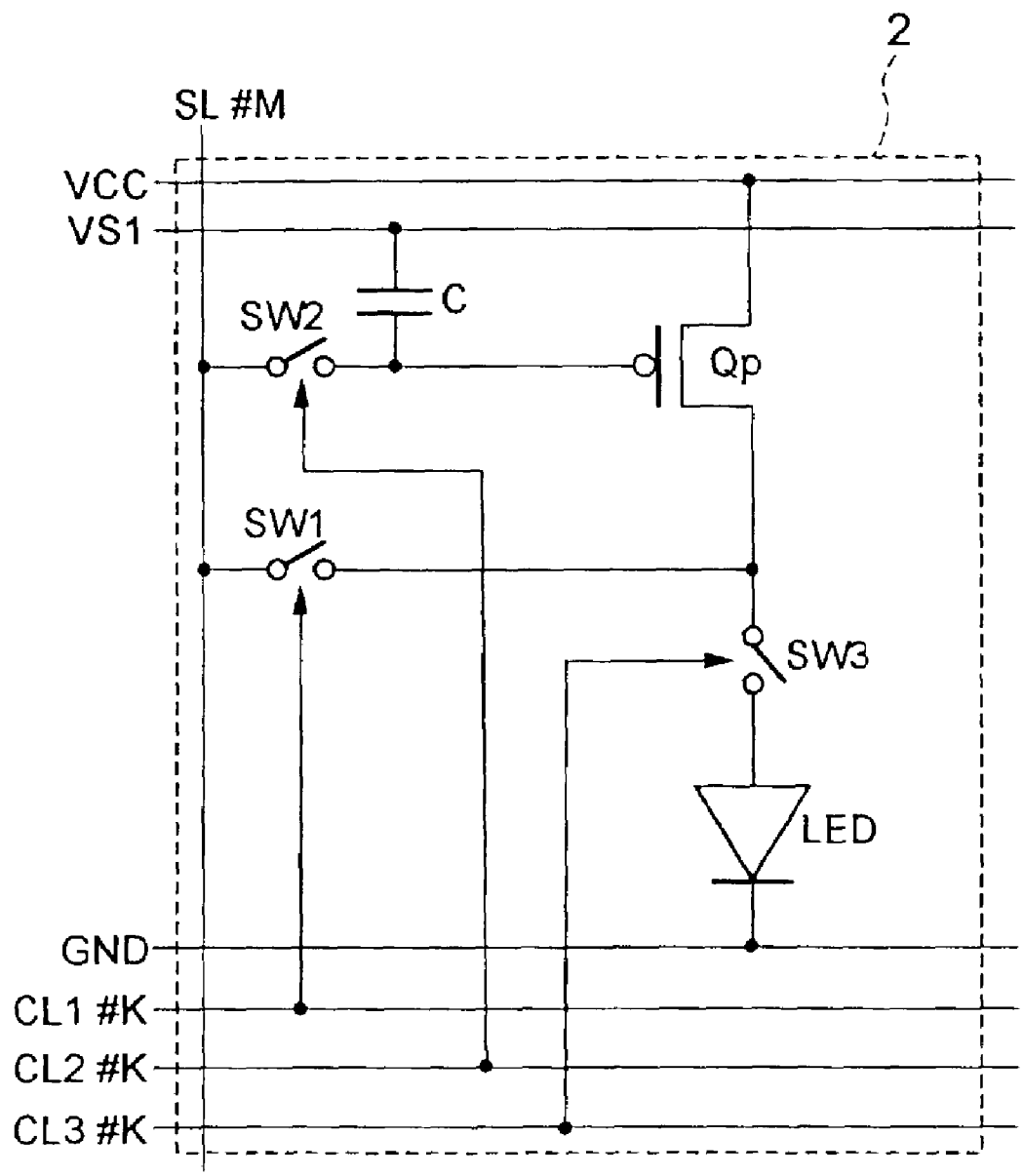
FIG. 28 is a (first) diagram showing a configuration of a pixel according to the thirteenth example of this invention.

FIG. 28 is a circuit diagram showing a configuration of a pixel according to a thirteenth example of this invention. A signal line SL (#M), a power supply line VCC, a ground line GND, a voltage supply line VS1, control lines CL1 (#K), CL2 (#K) and CL3 (#K) run through a pixel 2 according to this example, and a p-TFT Qp, switches SW1 to SW3, a capacitance element C and a light emitting device LED are arranged in the pixel 2. The source of the p-TFT Qp is connected to the power supply line VCC. The switch SW3, which is controlled by the control line CL3 (#K), is connected between the drain of the P-TFT Qp and an anode of the light emitting device LED, and the switch SW1, which is controlled by the control line CL1 (#K), is connected between the drain of the p-TFT Qp and the signal line SL. A cathode of the light emitting device LED is connected to the ground line GND. In addition, the switch SW2, which is controlled by the control line CL2 (#K), is connected between the signal line SL and the gate of the p-TFT Qp, and the capacitance element C is connected between the gate of the p-TFT Qp and the voltage supply line VS1.

Figure 29:
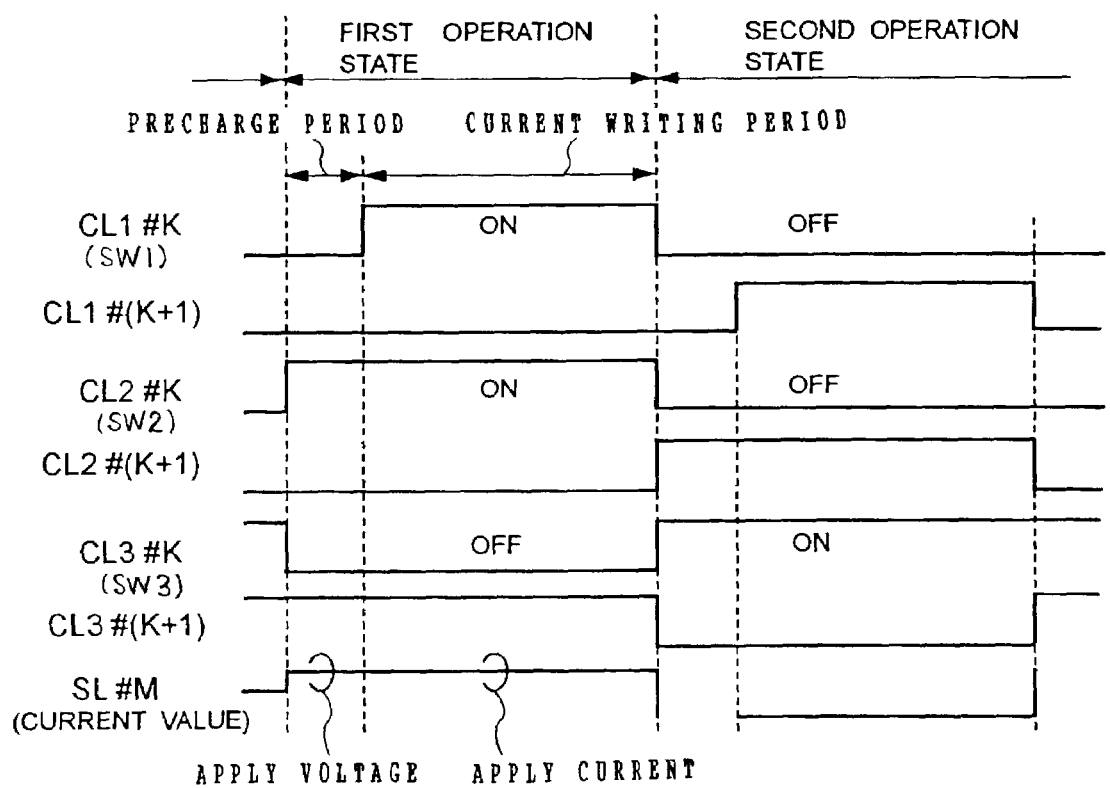
FIG. 29 is a timing chart of an operation according to the thirteenth example of this invention.

An operation according to the thirteenth example will be described below. FIG. 29 is a timing chart of an operation according to this example.

The first operation state (current retaining state or row selection period) in this example is a state where the Kth row is selected, and includes two periods. In the first period (precharge period), the switch SW1 is turned off by the control line CL1 (#K), the switch SW2 is turned on by the control line CL2 (#K) and the switch SW3 is turned off by the control line CL3 (#K). During this period, an appropriate voltage is applied to the gate of the p-TFT Qp through the signal line SL (#M). In the second period (current writing period), the switch SW1 is turned on by the control line CL1 (#K), and the switches SW2 and SW3 are not changed from the respective states in the first period. During this period, a current corresponding to a gray-scale level is supplied to the p-TFT Qp through the signal line SL (#K), the gate voltage of the p-TFT Qp is set at a value for passing the current across the drain and source thereof, and the voltage is maintained (retained) in the capacitance element C. The current writing period is equivalent to the first operation state in the first to twelfth examples.

The second operation state (current supplying state) in this example is a state where a row other than the Kth row in the display device is selected, in which the switches SW1 and SW2 are turned off by the signal in the control line CL1 (#K), and the switch SW3 is turned on by the signal in the control line CL3 (#K). In this operation state, as in the second operation state in the first to twelfth examples, the p-TFT Q supplies the current retained during the first operation state to the light emitting device LED.

This example is characterized in that the first operation state includes the precharge period in which a voltage is applied to the gate of the p-TFT Q. Applying an appropriate precharge voltage to the gate of the p-TFT Q during the precharge period can provide a shortened current writing period only enough for correction. Thus, the period of the first operation state (total of the precharge period and the current writing period) can be shortened. While the first operation state including the similar precharge period can be implemented in the first to twelfth examples, a current path exists during the precharge period. To the contrary, in this example, since the switch SW1 stays off during the precharge period, no current path exist, and the voltage can be applied with high precision.

Figure 30:
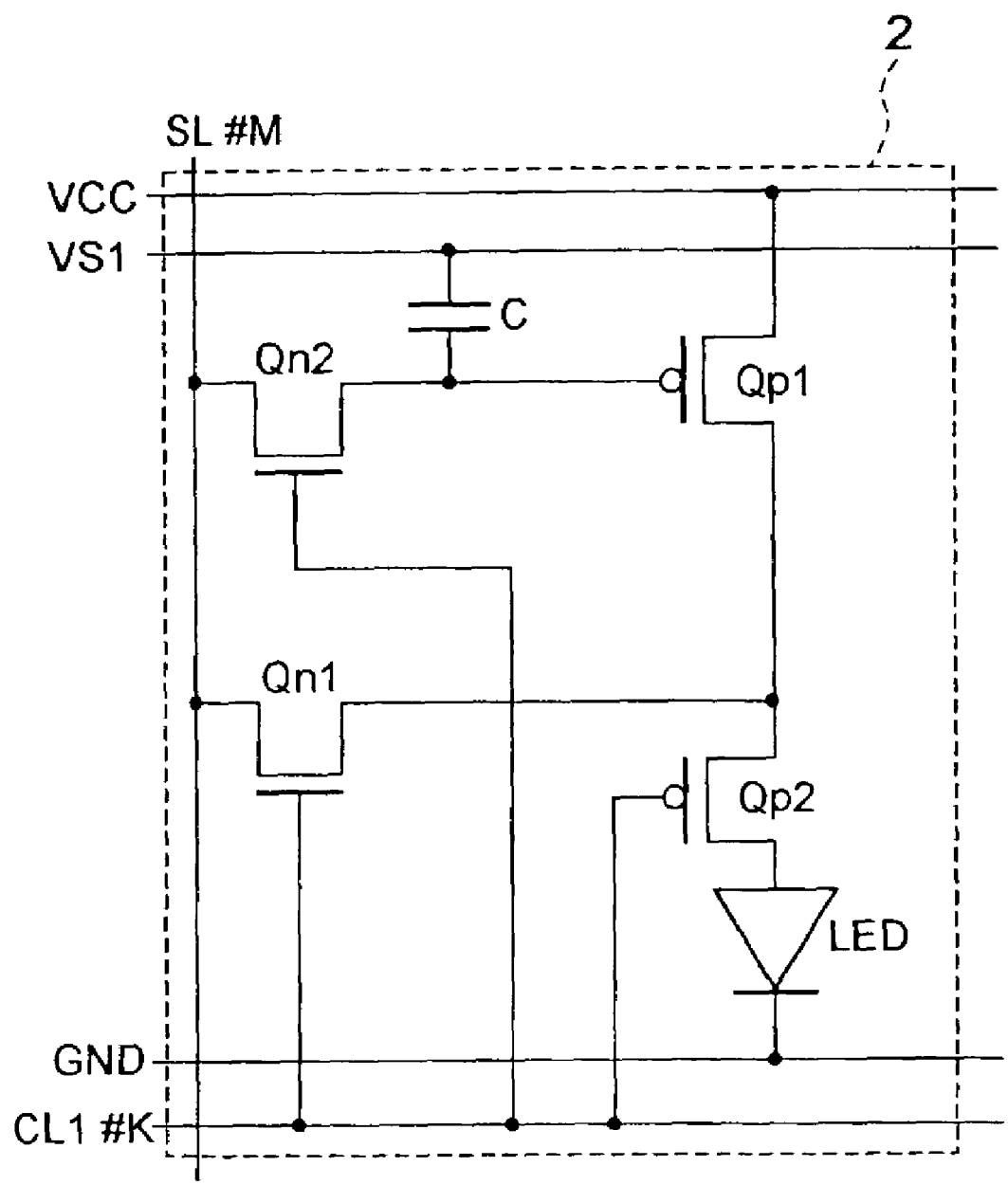
FIG. 30 is a (second) diagram showing a configuration of a pixel according to the thirteenth example of this invention.

Here, the arrangement according to the thirteenth example is implemented by modifying the connection of the switch SW2 in the arrangement according to the first example. Therefore, the first to twelfth examples can be similarly modified by changing the position of the switch SW2 as in the thirteenth example. FIG. 30 shows such a modification of the third example (FIG. 15) implemented by modifying the connection of the switch SW2 as in the example 13. These modified circuits can perform the same operation as that of the first to twelfth examples and the thirteenth example which has the precharge operation, with the advantages of those examples.

Fourteenth Example

Figure 31:
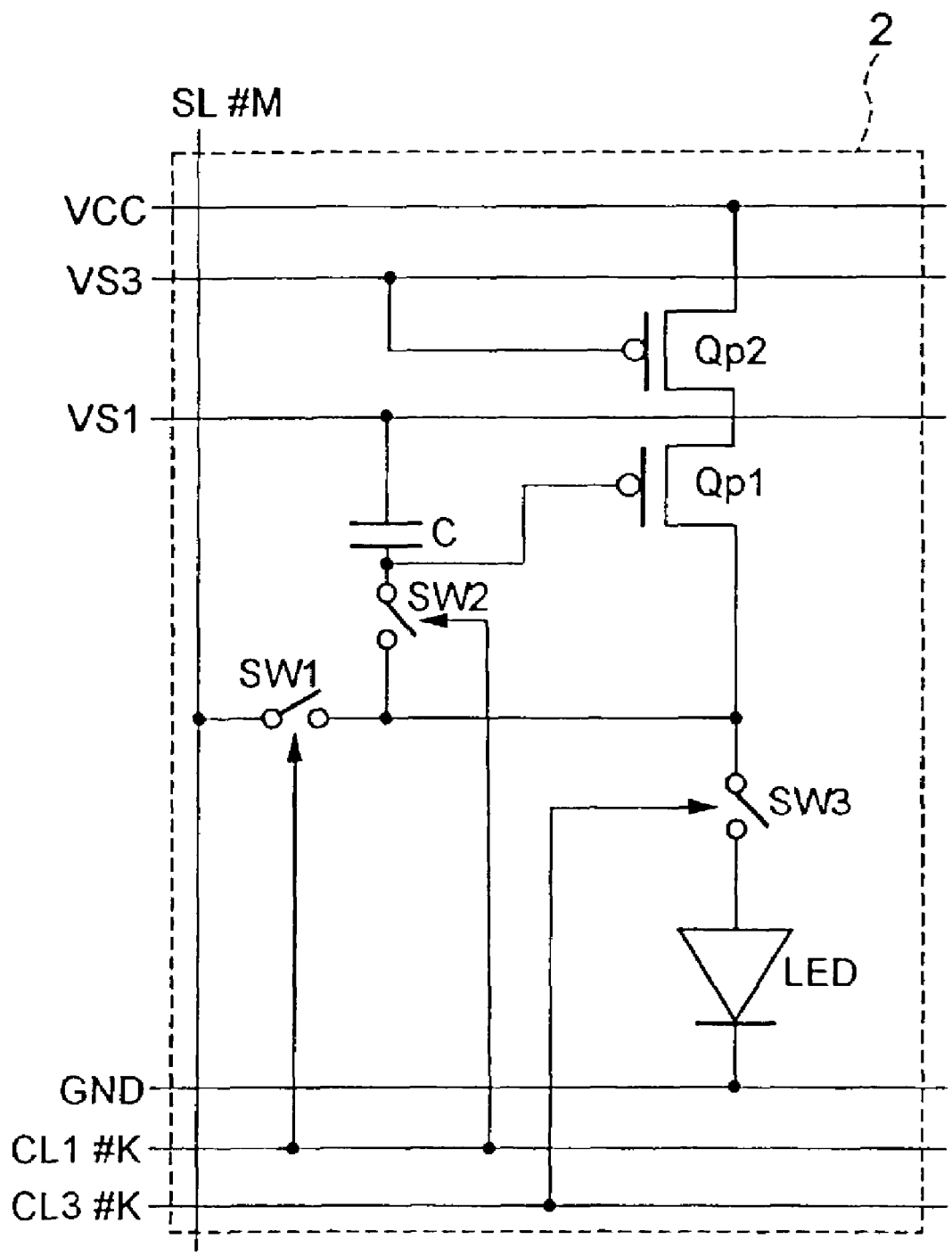
FIG. 31 is a (first) diagram showing a configuration of a pixel according to the fourteenth example of this invention.

FIG. 31 is a circuit diagram showing a configuration of a pixel according to a fourteenth example of this invention. A signal line SL (#M), a power supply line VCC, a ground line GND, voltage supply lines VS1,VS3, control lines CL1 (#K) and CL3 (#K) run through a pixel 2 according to this example, and a p-TFT Qp1, a p-TFT Qp2, switches SW1 to SW3, a capacitance element C and a light emitting device LED are arranged in the pixel 2. The source of the p-TFT Qp1 is connected to the power supply line VCC via the p-TFT Qp2. The switch SW3, which is controlled by the control line CL3 (#K), is connected between the drain of the P-TFT Qp1 and an anode of the light emitting device LED, and the switch SW1, which is controlled by the control line CL1 (#K), is connected between the drain of the p-TFT Qp1 and the signal line SL (#M). A cathode of the light emitting device LED is connected to the ground line GND. In addition, the switch SW2, which is controlled by the control line CL1 (#K), is connected between the gate and drain of the p-TFT Qp1, the capacitance element C is connected between the switch SW2 and the voltage supply line VS1, and the gate of the p-TFT Qp2 is connected to the voltage supply line VS3.

The operation in the fourteenth example is the same as that in the first example. However, in this example, the p-TFT Qp2, which is biased by the voltage supply line VS3, is provided. Therefore, for example, the p-TFT Qp1 and the p-TFT Qp2 can be both made to operate in the saturation region. Thus, the drain voltage dependency of the current/voltage characteristic of p-TFT Qp1 in the saturation region can be improved.

Figure 32:
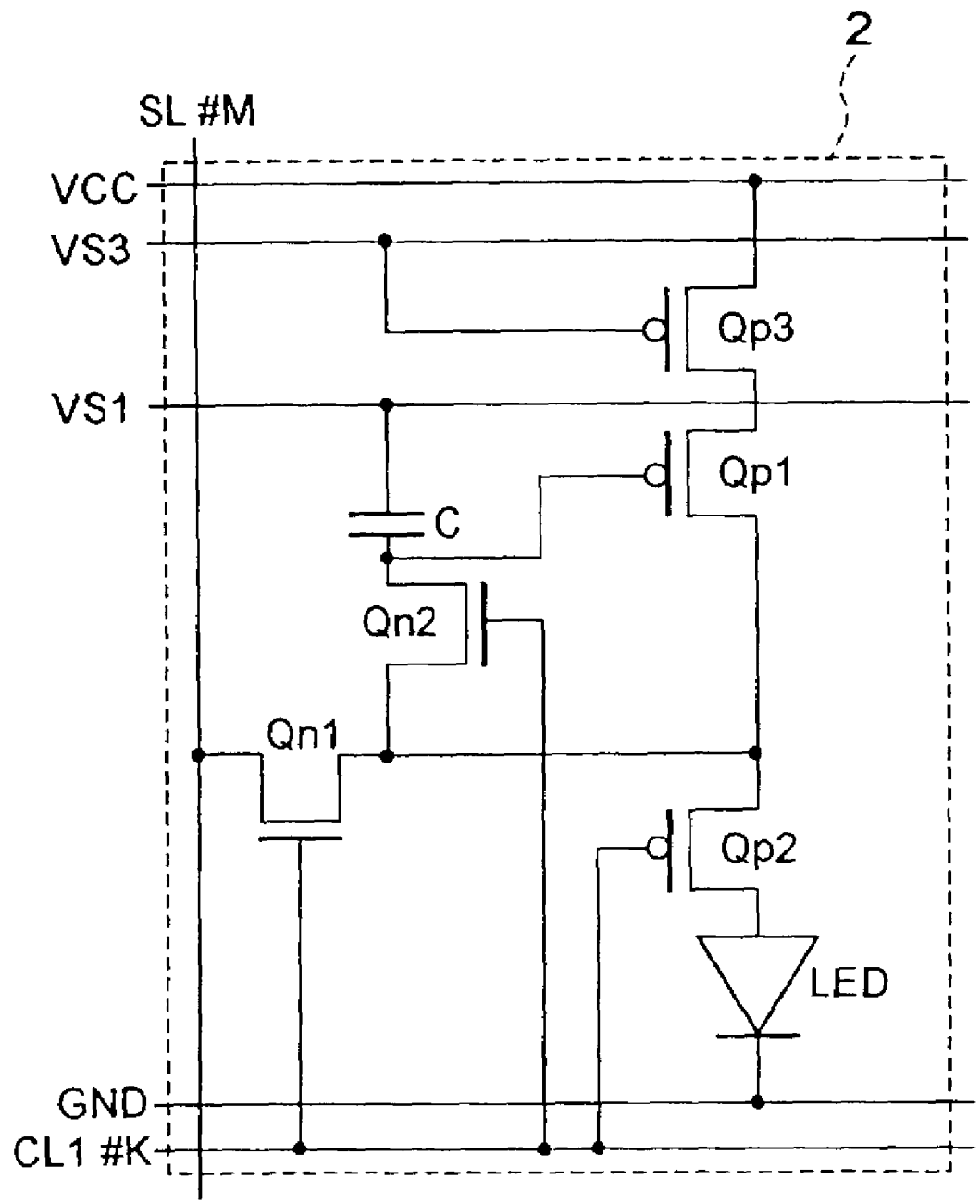
FIG. 32 is a (second) diagram showing a configuration of a pixel according to the fourteenth example of this invention.

Here, the arrangement according to the fourteenth example is implemented by adding the p-TFT Qp2 to the arrangement according to the first example. Therefore, the first to twelfth examples can be similarly modified by adding the p-TFT to the arrangements thereof as in the fourteenth example. FIG. 32 shows such a modification of the tenth example (FIG. 22) implemented by adding the p-TFT Qp3 thereto. Furthermore, the thirteenth example can be similarly modified by adding another p-TFT to the arrangement thereof as in the fourteenth example.

Fifteenth Example

Figure 33:
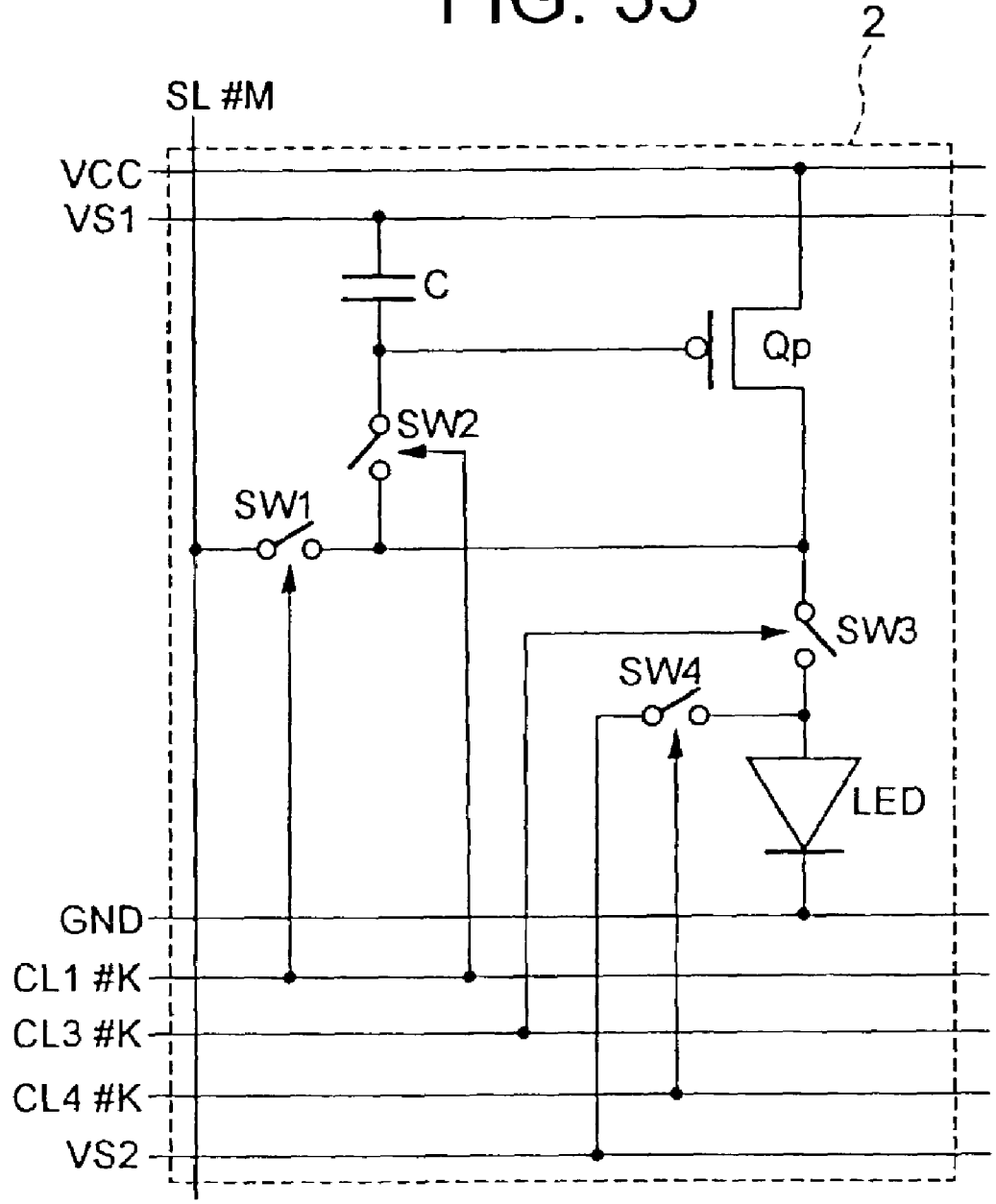
FIG. 33 is a (first) diagram showing a configuration of a pixel according to the fifteenth example of this invention.
Figure 34:
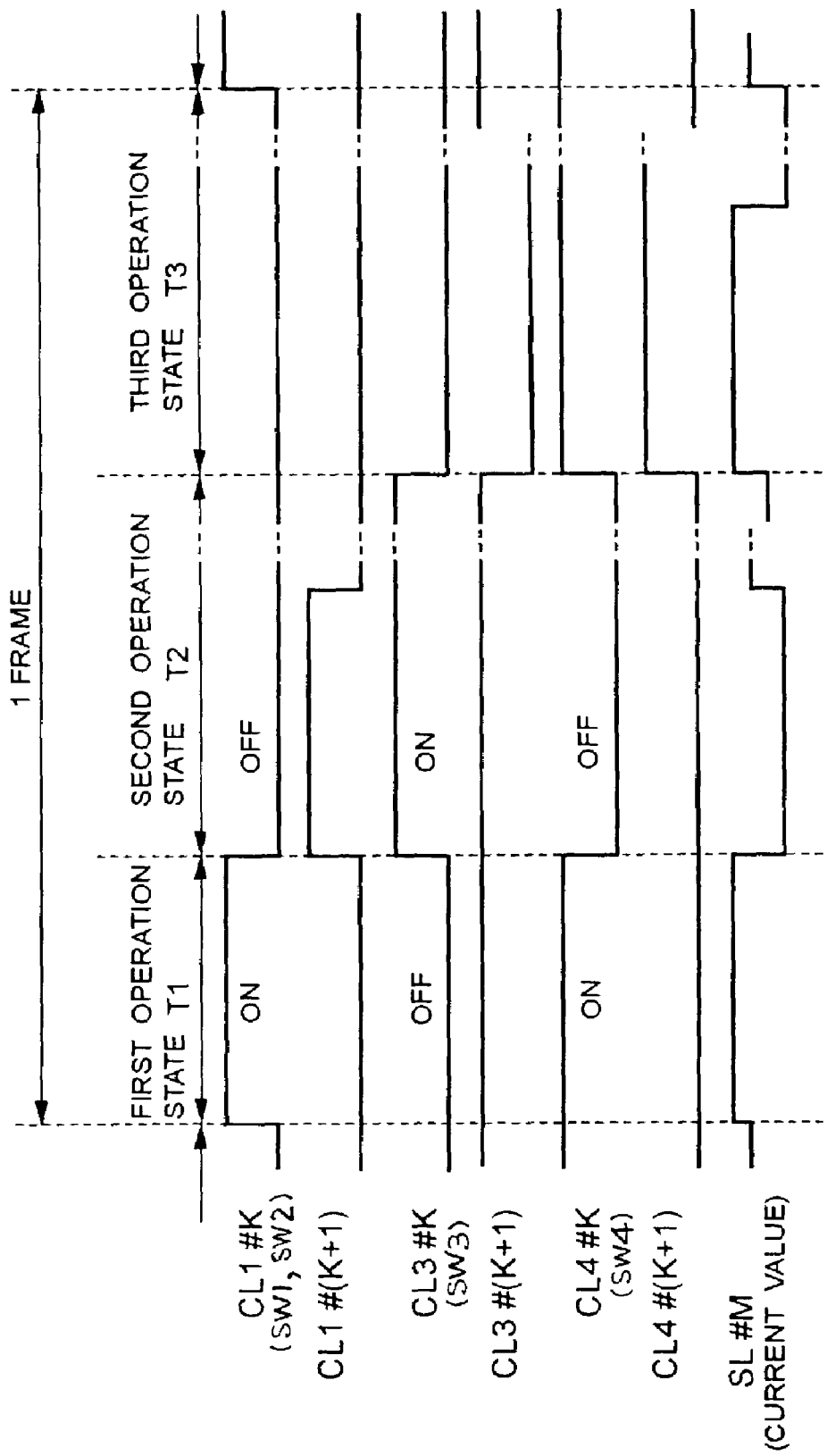
FIG. 34 is a timing chart of an operation according to the fifteenth example of this invention.

FIG. 33 is a circuit diagram showing a configuration of a pixel according to a fifteenth example of this invention, and FIG. 34 is a timing chart of an operation in this example. A signal line SL (#M), a power supply line VCC, a ground line GND, a voltage supply line VS1, a voltage supply line VS2, a control line CL1 (#K), a control line CL3 (#K) and a control line CL4 (#K) run through a pixel 2 according to the fifteenth example of this invention, and a p-TFT Qp, switches SW1 to SW4, a capacitance element C and a light emitting device LED are arranged in the pixel 2. The source of the p-TFT Qp is connected to the power supply line VCC, the switch SW3, which is controlled by the control line CL3 (#K), is connected between the drain of the p-TFT Qp and an anode of the light emitting device LED, and the switch SW1, which is controlled by the control line CL1, is connected between the drain of the p-TFT Qp and the signal line SL (#M). A cathode of the light emitting device LED is connected to the ground line GND. The switch SW4, which is controlled by the control line CL4 (#K), is connected between the anode of the light emitting device LED and the voltage supply line VS2. The switch SW2, which is controlled by the control line CL1 (#K), is connected between the drain and gate of the p-TFT Qp, and the capacitance element C is connected between the gate of the p-TFT Qp and the voltage supply line VS1.

In the first operation state (current retaining state or row selection period) in this operation example shown in FIG. 34, the Kth row in the display device is selected, the switches SW1 and SW2 are turned on by the control line CL1 (#K), the switch SW3 is turned off by the control line CL3 (#K), and the switch SW4 is turned on by the control line CL4 (#K) (however, operation is possible regardless of whether the switch SW4 is in on or off state, in this operation state). Besides, a current for providing an intended grayscale is supplied to the signal line SL (#M) based on the current-brightness characteristic of the light emitting device LED. In the first operation state, the voltage of the gate of the p-TFT Qp is the voltage which is corresponding to the current flowing across the drain and the source of the p-TFT Qp. The current is provided through the signal line SL(#M).

The second operation state (current supplying state) in this example is a state where a row other than the Kth row in the display device is selected, in which the switches SW1 and SW2 are turned off by the control line CL1 (#K), the switch SW3 is turned on by the control line CL3 (#K), and the switch SW4 is turned off by the control line CL4 (#K). In the second operation state, the gate voltage of the p-TFT Qp is held by the capacitance element C at the value in the first operation state, and thus, the voltage across the gate and source of the p-TFT Qp is the same as that in the first operation state. Since the current supplied thereto from the signal line SL (#M) in the first operation state is supplied to the light emitting device LED through the switch SW3, the light emitting device LED operates (emits light) to provide a brightness at an intended gray-scale level.

The third operation state (current stop state) in this example, in which a row other than the Kth row in the display device is selected, corresponds to a period in which the switch SW3 is turned off by the control line CL3 (#K) and the switch SW4 is turned on by the control line CL4 (#K) while the switches SW1 and SW2 are held in the off state by the control line CL1 (#K). At the start of this operation state, the switch SW3 is turned off and the switch SW4 is turned on, whereby any current is not supplied to the light emitting device LED, and the voltage VS3 is applied to the anode of the light emitting device. When the voltage VS3 is lower than the emitting voltage of the light emitting device LED, the light emitting device LED instantaneously stops the operation (light emission) at the start of the operation state.

As in the other examples, according to this example, a current can be retained quickly and the retained current can be supplied to the light emitting device LED with high precision.

As in the ninth to twelfth examples, according to this example, the current passing through the signal line SL into the light emitting device LED can be increased. Thus, a time required for charging a wiring capacitance such as signal line can be reduced, and the period of the first operation state required for retaining the current can be shortened. Therefore, this example is ready for the increase of the wiring capacitance element C and the reduction of the selection time due to higher definition and larger screen.

In addition, according to this example, the switch SW4 is provided and can be turned on to apply the voltage VS3 to the light emitting device LED at the start of the third operation state, thereby instantaneously stopping the light emission. In the ninth to twelfth examples, even if the current path is interrupted by the switch SW3, a current is supplied to the light emitting device due to the charges stored in the capacitance of the light emitting device itself. Thus, the light emitting device continues to operate (emit light) until the voltage across the capacitance is sufficiently reduced. This light emission causes an error in determining the brightness of the display device based on the brightness in the second operation state and the periods of the respective operation states. On the other hand, according to this example, since the light emission can be stopped instantaneously by the switch SW4, the brightness of the display device can be determined with high precision based on the brightness in the second operation state and the periods of the first, second and third operation states. Also, as in the ninth to twelfth examples, since the light emission halts in the third operation state, the display operation is similar to that of CRTs, and thus, moving images can be displayed with high quality.

Figure 35:
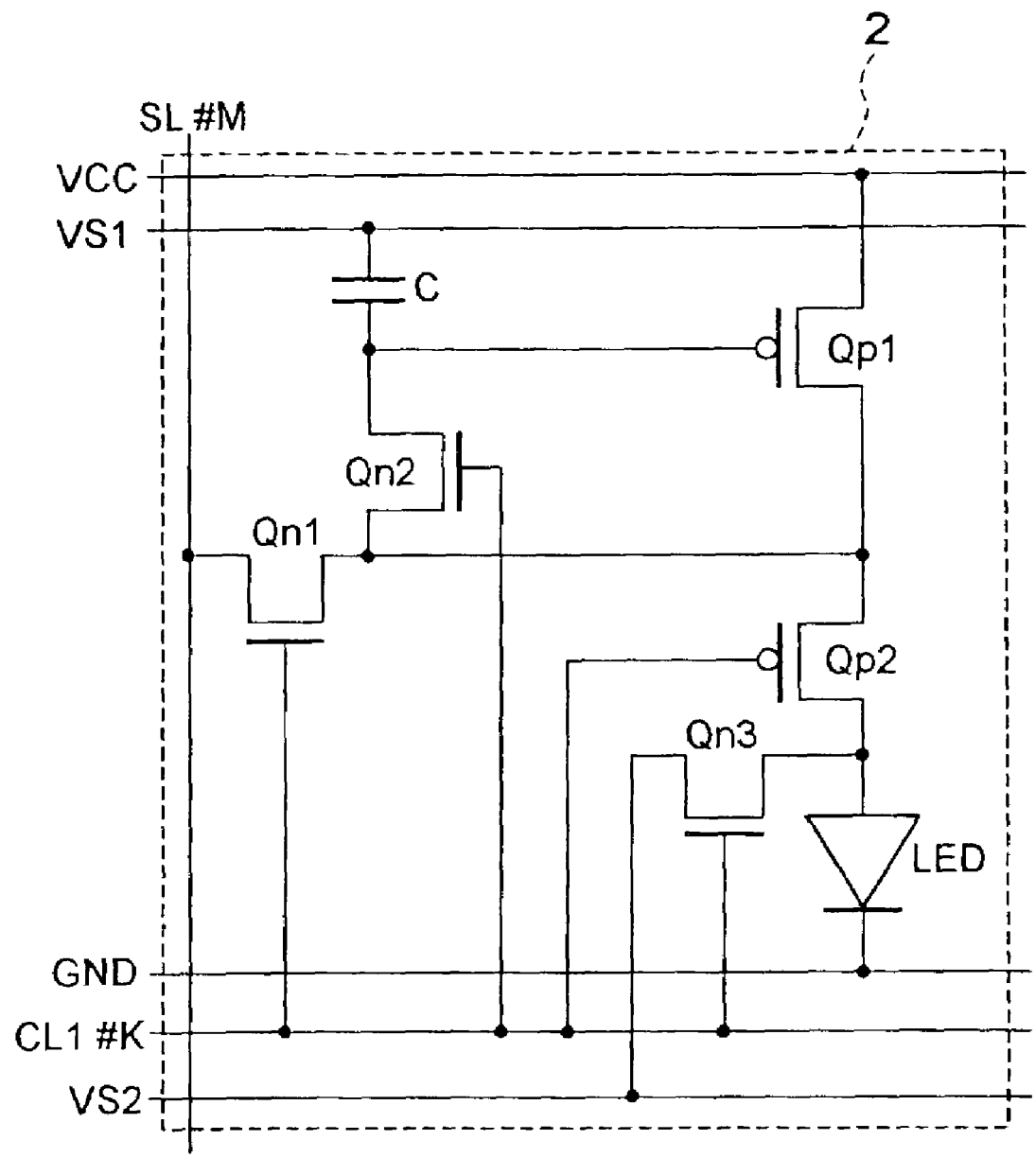
FIG. 35 is a (second) diagram showing a configuration of a pixel according to the fifteenth example of this invention.
Figure 36:
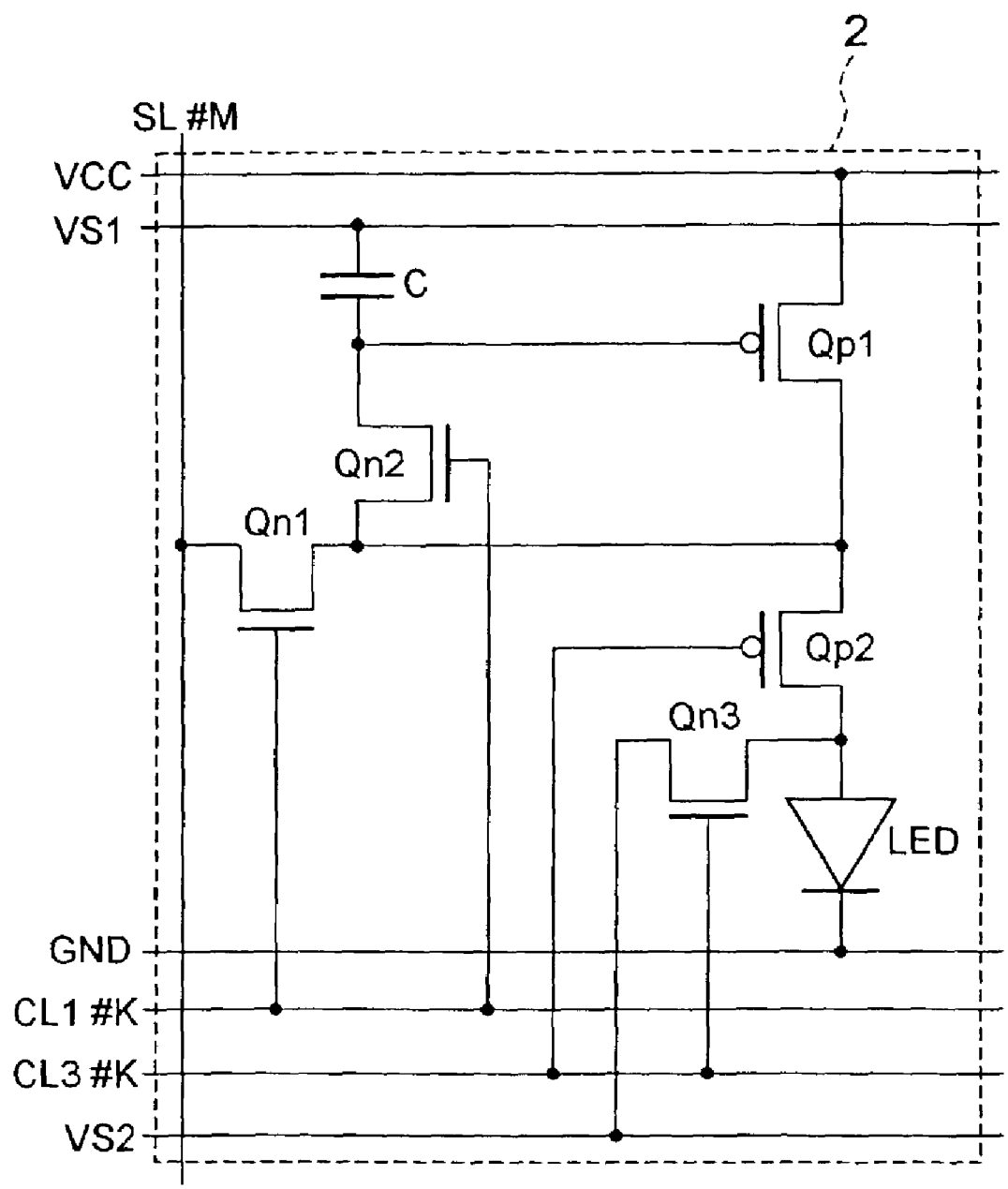
FIG. 36 is a (third) diagram showing a configuration of a pixel according to the fifteenth example of this invention.

Here, the arrangement according to the fifteenth example is implemented by adding the switch SW4, the control line CL4 (#K) and the voltage supply line VS2 to the arrangement according to the first example (FIG. 10). Therefore, the first to twelfth examples can be similarly modified by adding the switch SW4, or TFT and its control line to the arrangements thereof as in the fifteenth example. FIG. 35 shows such a modification of the third example (FIG. 15) implemented by adding the n-TFT Qn3 and voltage supply line VS2 thereto. FIG. 36 shows such a modification of the tenth example (FIG. 22) implemented by adding the n-TFT Qn3 and the voltage supply line VS2 thereto. Furthermore, adding the switch SW4 (or TFT serving as a switch) to the arrangements according to the thirteenth and fourteenth examples can provide modifications with the characteristics of this example in addition to the characteristics of the thirteenth and fourteenth examples, respectively.

In the fifteenth example, the voltage supply line VS2 is only needed to feed a voltage for stopping the light emission momentarily when entering the third operation state. Therefore, for example, it may be integrated with the ground line GND to simplify the configuration of the pixel 2 in this example.

Sixteenth Example

In the first to fifteenth examples, the voltage supply line VS1, which is connected to one terminal of the capacitance element having the other terminal thereof connected to the gate of the TFT, is assumed to be kept at a constant voltage. Therefore, the power supply line VCC or ground line GND may serve also as the voltage supply line VS1, and in such a case, the configuration of the pixel can be simplified. The value of the current to be supplied to the light emitting device can be changed by varying the voltage value of the voltage supply line VS1 in the first operation state from that in the other operation states.

For example, if the voltage of the voltage supply line VS1 is shifted from the value in the first operation state to a level that causes the TFT to be turned off, the TFT can be turned off on the boot effect. If such an operation is performed on the entire light emitting display device or on each line, the entire light emitting display device or each line can be brought into the black state (a state where the light emitting devices are not activated).

The preferred embodiments and examples have been described above. However, this invention is not limited thereto and can be appropriately altered without departing the spirit and scope thereof. For example, as described above, elements other than the light emitting device including an inorganic EL and an organic EL device such as a light emitting diode may be used, and a general current load element may be used. The third switch (SW3), which is inserted in the current path of the light emitting device, may be disposed on the side of the poser supply line (or ground line), rather than on the side of the driving transistor for the light emitting device. Furthermore, while the fourth switch (SW4) is provided only in the case where the third switch is turned off earlier in the examples, it may be provided in the display device in which the third switch is turned off when the first switch is turned on. Furthermore, the switch used in this invention is not limited to the TFT switch. The switch is essentially prescribed with regard to operation thereof. While the examples involving the simplified configuration have been described in the above-described examples, the transistor serving as the switch may have any polarity as far as it adequately operates.

A first advantage of this invention is that a precise current can be supplied to the current load element. A first reason therefor is that the signal is supplied to the signal line via the current, and the same transistor serves both to retain the current flowing through the signal line and to supply the current to the current load element, thereby preventing the performance of the current load element from being affected by the characteristic variation between the transistors. A second reason therefor is that the current from the signal line can be retained accurately because the current is retained in the state where any current is not supplied to the current load element.

A second advantage is that a time required for retaining the current is short, and a higher definition can be supported. This is due to the fact that the switch between the transistor for retaining the current and the current load element stays off during a period of retaining the current, and thus, the retaining of the current can be conducted without being affected by the high load of the current load element (capacitance and resistance in parallel).

Furthermore, according to the example in which the switch SW2 is turned off earlier than the switch SW1, the noise caused when the switch SW1 is changed in its state can be prevented from being transmitted to the gate of the TFT for driving the current load element. Thus, a high precision current can be supplied to the current load element.

Furthermore, according to the example in which the switch SW2 is interposed between the signal line and the gate of the transistor for supplying a current, highly precise precharging operation can be performed, and the period for retaining the current can be shortened.

Furthermore, according to the example in which the transistor is interposed between the transistor for supplying a current and the power supply line, the drain voltage dependency of the drain current of the transistor for supplying a current can be improved by appropriately biasing the gate of the transistor. Thus, a high precision current can be supplied to the current load element.

In the case where the current load element is the light emitting device, according to the example in which an operation state where any current does not flow through the light emitting device is provided during a period in which the pixel is deselected, the current to be retained can be increased, so that the current can be retained in a shorter time, and the operation becomes similar to that of CRTs, so that an afterimage is hard to remain. Thus, moving images can be displayed with higher quality.

What is claimed is:

1. A current load device, comprising:
   a driving transistor having a source connected to a power supply line or ground line;
   a first switch connected between a signal line supplied with a current or voltage and a drain of said driving transistor;
   a second switch connected between said signal line or the drain of said driving transistor and a gate of said driving transistor;
   a capacitance element having one terminal connected to a first voltage supply line and the other terminal connected to the gate of said driving transistor; and
   a serially-connected assembly of a current load element and a third switch, the serially-connected assembly being connected between the ground line or power supply line and the drain of said driving transistor;
   wherein the power supply line and the first voltage supply carry different voltages.

2. A current load device, comprising:
   a first transistor having a source connected to a power supply line or ground line and a gate connected to a second voltage supply line;
   a driving transistor serially connected to said first transistor;
   a first switch connected between a signal line supplied with a current or voltage and a drain of said driving transistor;
   a second switch connected between said signal line or the drain of said driving transistor and a gate of said driving transistor;
   a capacitance element having one terminal connected to a first voltage supply line and the other terminal connected to the gate of said driving transistor; and
   a serially-connected assembly of a current load element and a third switch, the serially-connected assembly being connected between the ground line or power supply line and the drain of said driving transistor.

3. A current load device, comprising:
   a driving transistor having a source connected to a power supply line or ground line;
   a first switch connected between a signal line supplied with a current or voltage and a drain of said driving transistor;
   a second switch connected between said signal line or the drain of said driving transistor and a gate of said driving transistor;
   a capacitance element having one terminal connected to a first voltage supply line and the other terminal connected to the gate of said driving transistor; and a serially-connected assembly of a current load element and a third switch, the serially-connected assembly being connected between the ground line or power supply line and the drain of said driving transistor;

wherein in a first operation state, said first and second switches are turned on and said third switch is turned off to store a gate voltage in accordance with current/voltage characteristics of said driving transistor in said capacitance element so that the current flowing through said signal line flows between the drain and source of said driving transistor without passing a current through said current load element, and then in a second operation state, said first and second switches are turned off and the third switch is turned on to let said driving transistor supply the current whose value is the same that of current having flowed through the signal line in said first operation state to said current load element through said third switch.

4. A current load device, comprising:

a driving transistor having a source connected to a power supply line or ground line;

a first switch connected between a signal line supplied with a current or voltage and a drain of said driving transistor;

a second switch connected between said signal line or the drain of said driving transistor and a gate of said driving transistor;

a capacitance element having one terminal connected to a first voltage supply line and the other terminal connected to the gate of said driving transistor; and a serially-connected assembly of a current load element and a third switch, the serially-connected assembly being connected between the ground line or power supply line and the drain of said driving transistor;

wherein in a first operation state, said first and second switches are turned on and said third switch is turned off to apply the voltage applied to said signal line to the gate of said driving transistor and said capacitance element without passing a current through said current load element, and then a gate voltage in accordance with current/voltage characteristics of said driving transistor is stored in said capacitance element so that the current flowing through said signal line flows between the drain and source of said driving transistor, and in a second operation state, said first and second switches are turned off and the third switch is turned on to let said driving transistor supply the current whose value is the same that of current having flowed through the signal line in said first operation state to said current load element through said third switch.

5. A current load device, comprising:

a driving transistor having a source connected to a power supply line or ground line;

a first switch connected between a signal line supplied with a current or voltage and a drain of said driving transistor;

a second switch connected between said signal line or the drain of said driving transistor and a gate of said driving transistor;

a capacitance element having one terminal connected to a first voltage supply line and the other terminal connected to the gate of said driving transistor; and a serially-connected assembly of a current load element and a third switch, the serially-connected assembly being connected between the ground line or power supply line and the drain of said driving transistor;

wherein in a first operation state, said second switch between said signal line and said driving transistor is turned on and said first and third switches are turned off to apply the voltage applied to said signal line to the gate of said driving transistor and said capacitance element without passing a current through said current load element, and then, said first and second switches are turned on and said third switch is turned off to store a gate voltage in accordance with current/voltage characteristics of said driving transistor in said capacitance element so that the current flowing through said signal line flows between the drain and source of said driving transistor, and in a second operation state, said first and second switches are turned off and the third switch is turned on to let said driving transistor supply the current whose value is the same that of current having flowed through the signal line in said first operation state to said current load element through said third switch.

6. The current load device according to claim 3, wherein said third switch is turned off before said first switch is turned on, and is turned on after said first switch is turned off.

7. The current load device according to claim 3, wherein said second switch is turned off before said first switch is turned off.

8. The current load device according to claim 1, wherein said driving transistor is constituted by a thin film transistor (TFT).

9. The current load device according to claim 1, wherein the first, second and third switches are each constituted by a TFT.

10. The current load device according to claim 1, wherein said first and second switches are TFTs having a same polarity, and said third switch is a TFT having a polarity opposite to that of said first and second switches.

11. The current load device according to claim 1, wherein said first, second and third switches are controlled by one control line.

12. The current load device according to claim 1, wherein said first and second switches are controlled by one control line.

13. The current load device according to claim 1, wherein said first and third switches are controlled by one control line.

14. The current load device according to claim 1, wherein a TFT which has the drain and source short-circuited and operates oppositely to said second switch TFT is connected between said second switch TFT and said driving transistor TFT as a dummy switch.

15. The current load device according to claim 14, wherein a ratio (W/L) between a length (L) and a width (W) of the gate of said dummy switch TFT is a half the ratio between the length and the width of the gate of said second switch TFT.

16. A current load device comprising:

a driving transistor having a source connected to a power supply line or ground line;

a first switch connected between a signal line supplied with a current or voltage and a drain of said driving transistor;

a second switch connected between said signal line or the drain of said driving transistor and a gate of said driving transistor;

a capacitance element having one terminal connected to a first voltage supply line and the other terminal connected to the gate of said driving transistor; and a serially-connected assembly of a current load element and a third switch, the serially-connected assembly being connected between the ground line or power supply line and the drain of said driving transistor; and a fourth switch having one terminal connected between said third switch and said current load element and another terminal connected to a third voltage supply line.

17. The current load device according to claim 16, wherein a value of a voltage applied to said third voltage supply line is lower than a voltage value for said current load element to start to operate.

18. The current load device according to claim 17, wherein said fourth switch is turned on when said third switch is turned off, whereby charges stored in said current load element are forcedly removed and the current flowing through said current load element is quickly stopped.

19. The current load device according to claim 16, wherein said fourth switch is constituted by a TFT.

20. The current load device according to claim 19, wherein said third and fourth switches are TFTs having opposite polarities, whereby said third and fourth switches are controlled by one control line.

21. The current load device according to claim 1, wherein said first voltage supply line is the power supply line or ground line.

22. The current load device according to claim 3, wherein the voltage applied through said first voltage supply line differs between said first operation state and said second operation state.

23. The current load device according to claim 1, wherein said current load element is a light emitting device.

24. The current load device according to claim 1, wherein said current load element is an organic EL device.

25. The current load device according to claim 4, wherein the voltage applied through said first voltage supply line differs between said first operation state and said second operation state.

26. The current load device according to claim 5, wherein the voltage applied through said first voltage supply line differs between said first operation state and said second operation state.

* * * * *